(12) United States Patent
Nasu et al.

(10) Patent No.: US 6,282,340 B1
(45) Date of Patent: Aug. 28, 2001

(54) LIGHT WAVELENGTH TUNING DEVICE AND LIGHT SOURCE OPTICAL DEMULTIPLEXER AND WAVELENGTH DIVISION MULTIPLEXED OPTICAL COMMUNICATION SYSTEM USING THE TUNING DEVICE

(75) Inventors: Hideyuki Nasu, Hiratsuka; Hideyuki Omura, Chigasaki; Kazuo Kogure, Urawa; Tomoyuki Kato, Tokyo, all of (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/290,306

(22) Filed: Apr. 19, 1999

(30) Foreign Application Priority Data

Apr. 23, 1998 (JP) .................................................. 10-113840
May 12, 1998 (JP) .................................................. 10-129168

(51) Int. Cl.⁷ .............................. G02B 6/26; H01S 3/13; H04J 14/00
(52) U.S. Cl. ................................. 385/37; 372/6; 372/20; 359/124; 359/130
(58) Field of Search .......................... 385/37, 24; 372/6, 372/20; 359/124, 130

(56) References Cited

U.S. PATENT DOCUMENTS

| | | | |
|---|---|---|---|
| 4,815,081 | * 3/1989 | Mahlein et al. | 372/32 |
| 5,077,816 | * 12/1991 | Glomb et al. | 385/37 |
| 5,159,601 | * 10/1992 | Huber | 372/6 |
| 5,271,024 | * 12/1993 | Huber | 372/6 |
| 5,299,212 | * 3/1994 | Koch et al. | 372/32 |
| 5,684,590 | * 11/1997 | Sanders et al. | 356/350 |
| 5,691,999 | * 11/1997 | Ball et al. | 372/20 |
| 5,796,096 | * 8/1998 | Rakuljic et al. | 250/226 |
| 5,914,972 | * 6/1999 | Siala et al. | 372/33 |
| 5,943,152 | * 8/1999 | Mizrahi et al. | 359/187 |
| 5,993,073 | * 11/1999 | Hamakawa et al. | 385/88 |
| 5,999,546 | * 12/1999 | Espindola et al. | 372/20 |
| 6,018,534 | * 1/2000 | Pan et al. | 372/6 |
| 6,058,131 | * 5/2000 | Pan | 372/102 |
| 6,101,301 | * 8/2000 | Engelberth et al. | 385/37 |
| 6,111,681 | * 9/2000 | Mizrahi et al. | 359/187 |
| 6,115,403 | * 9/2000 | Brenner et al. | 372/102 |

FOREIGN PATENT DOCUMENTS 2546151  8/1996  (JP) .
10-096827  4/1998  (JP) .

OTHER PUBLICATIONS

Mao, Charles et al., "Laser Wavelength Stabilization Using Holographic Filters", IEEE/LEOS meeting on optical networks and their enabling technologics, Jul. 11–13, 1994, Lake Tahoe, NV.

* cited by examiner

Primary Examiner—Jon Henry
(74) Attorney, Agent, or Firm—Frishauf, Holtz, Goodman, Langer & Chick, P.C.

(57) ABSTRACT

The optical output of an optical device branched by means of an optical coupler is partially fetched by means of a wavelength stabilizer that includes an FBG section, whereby the passing wavelength characteristic of a fiber grating, which is believed originally to depend little on temperature, can be prevented from further changing. The wavelength of the optical device is tuned by means of a light wavelength tuning device that includes the wavelength stabilizer. Thus, the tuned wavelength is less liable to suffer an error that is attributable to the change of environmental temperature, so that the temperature dependence of the wavelength tuning operation is lowered.

12 Claims, 24 Drawing Sheets

F I G. 9
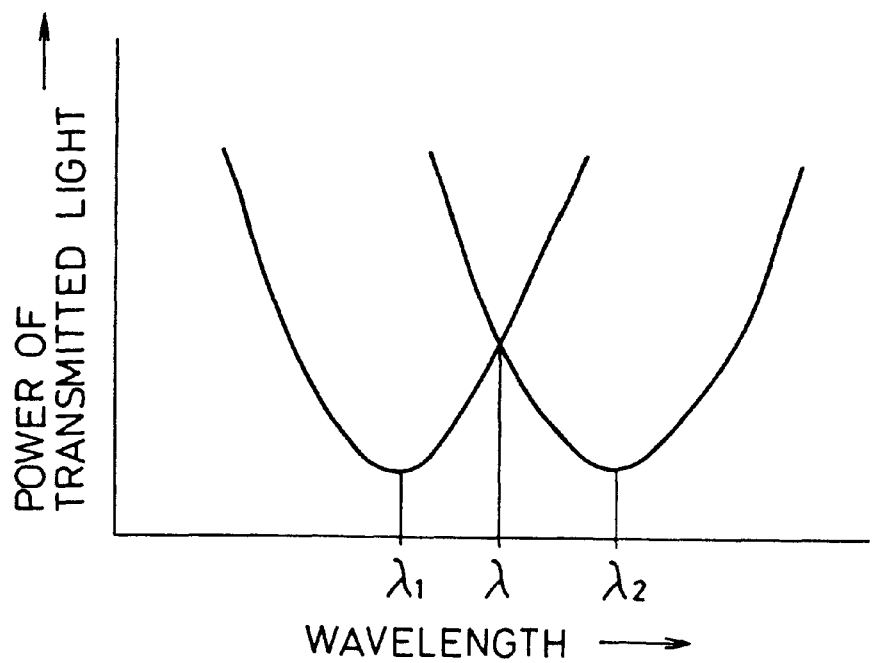
F I G. 10
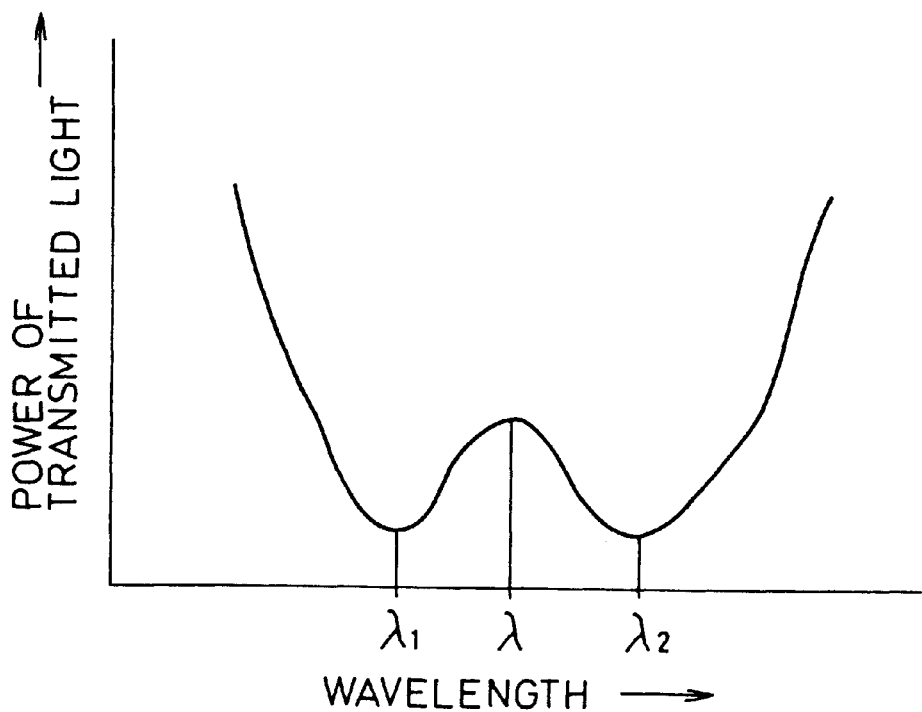

F I G. 17
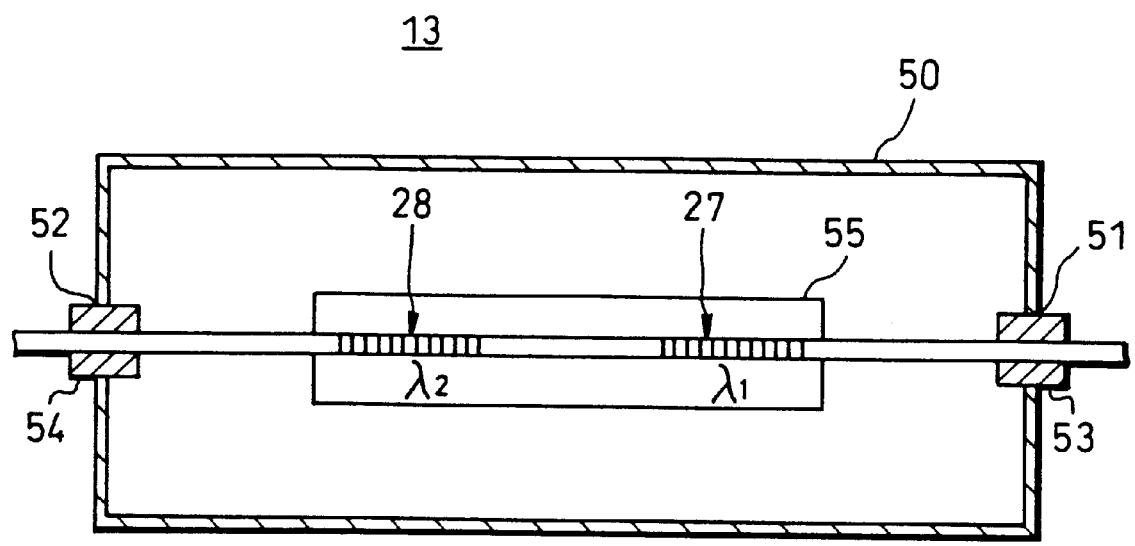
F I G. 18
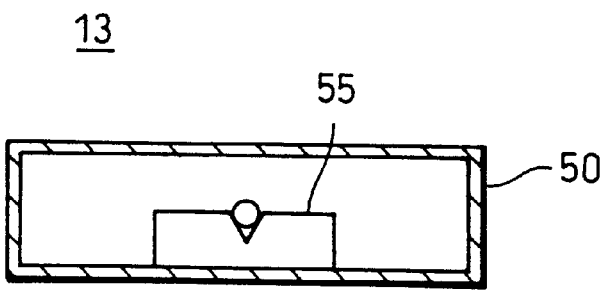

F I G. 26
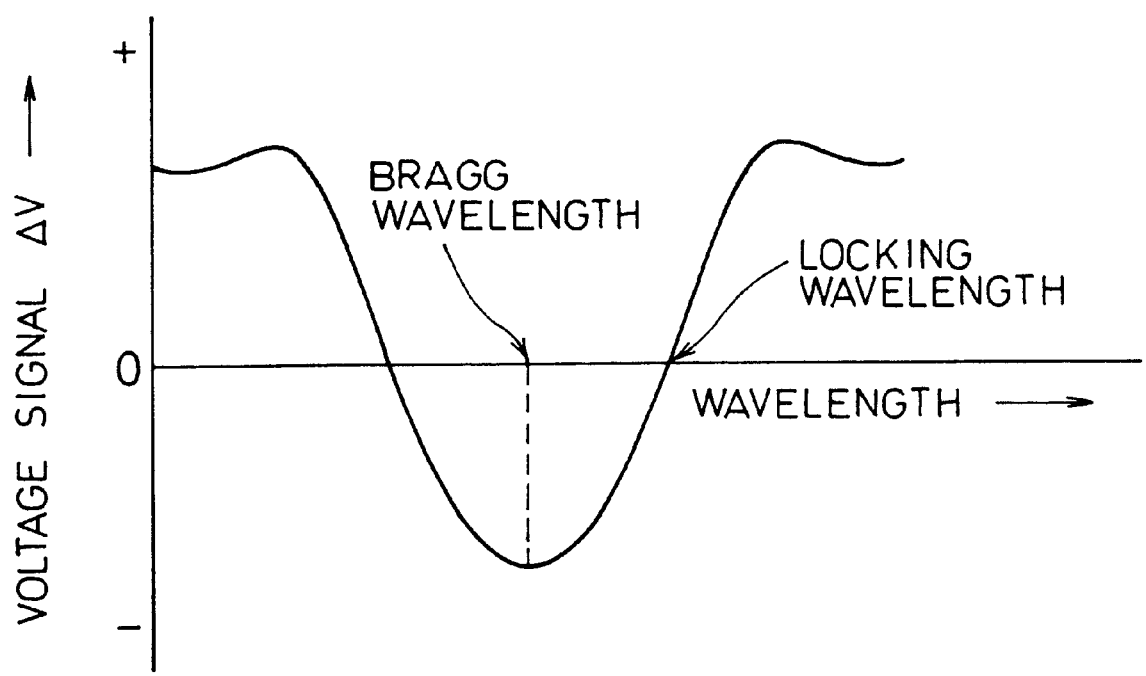

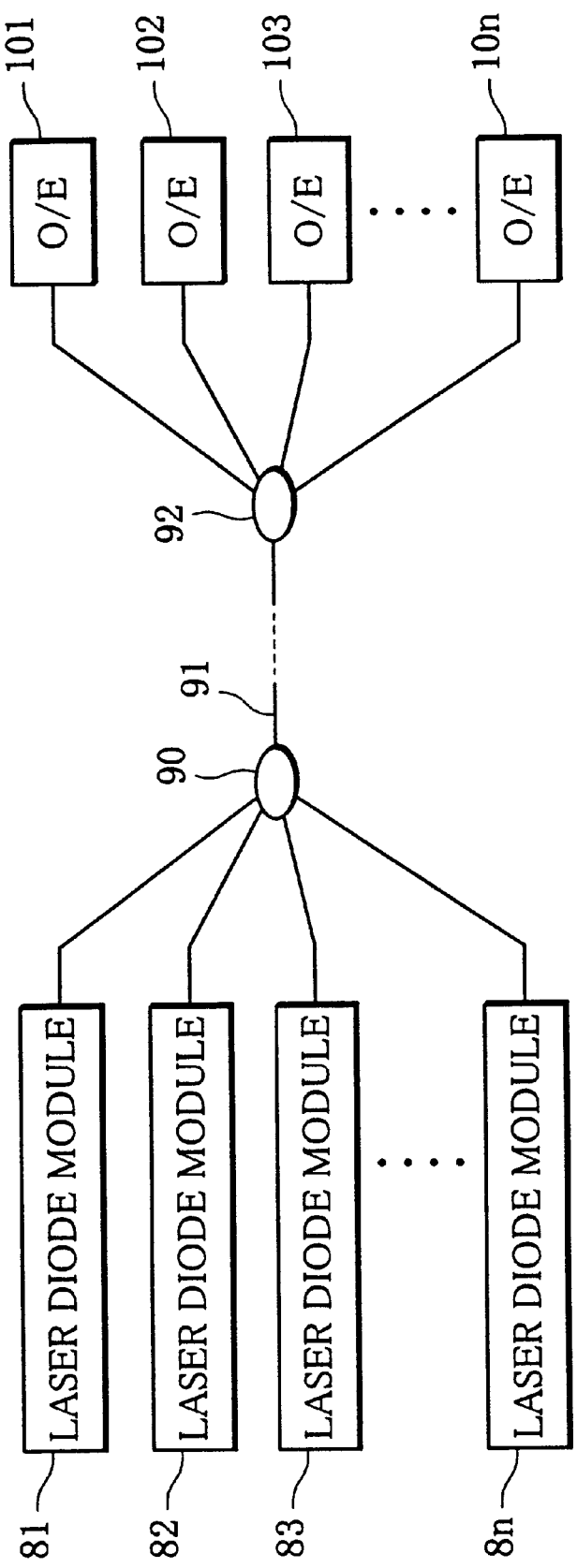

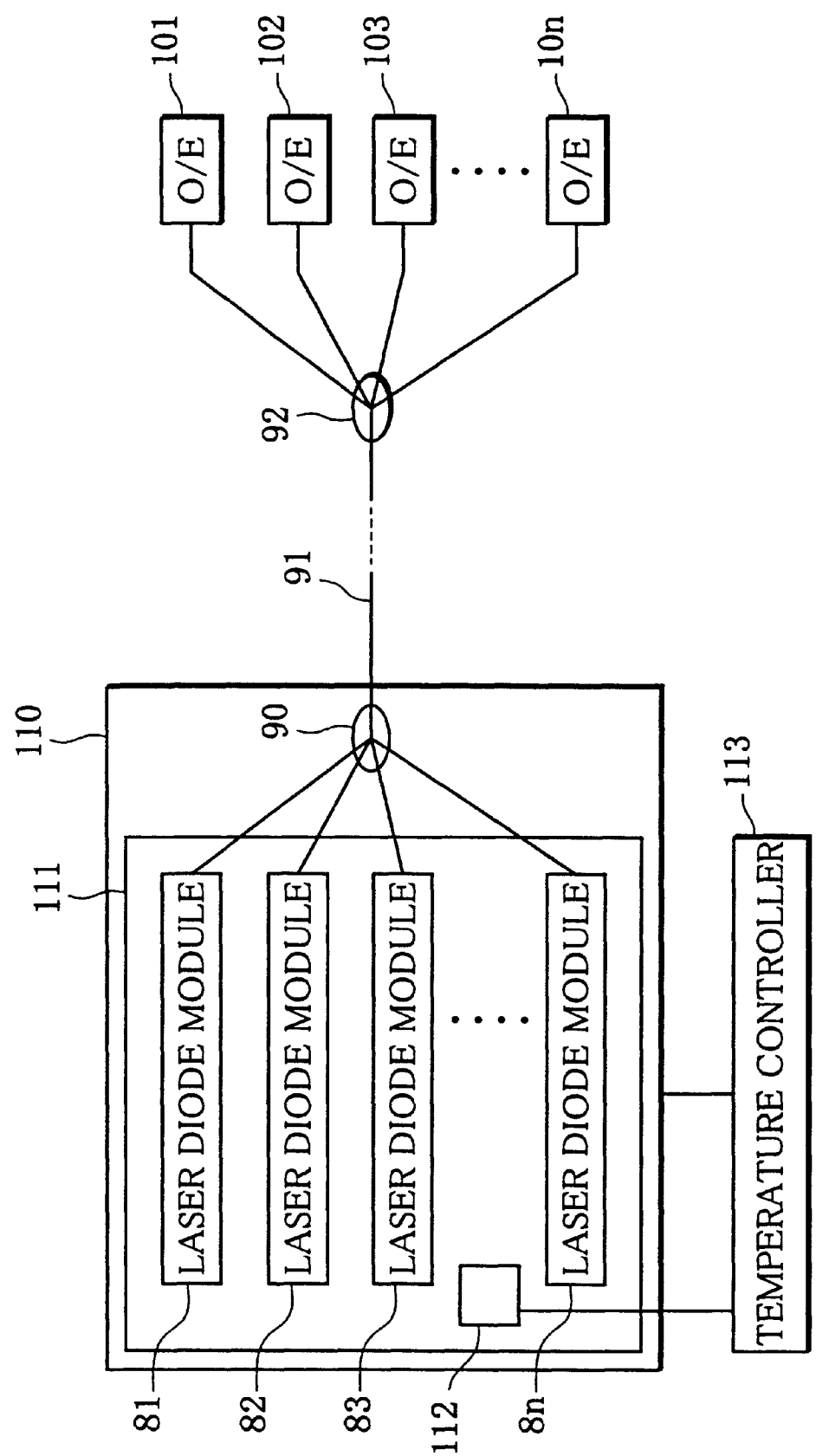

LIGHT WAVELENGTH TUNING DEVICE AND LIGHT SOURCE OPTICAL DEMULTIPLEXER AND WAVELENGTH DIVISION MULTIPLEXED OPTICAL COMMUNICATION SYSTEM USING THE TUNING DEVICE

BACKGROUND OF THE INVENTION

1. Field of the Invention

The present invention relates to a light wavelength tuning device for tuning the wavelength of light emitted from an optical device, and a light source, optical demultiplexer and wavelength division multiplexed optical communication system using the tuning device.

2. Description of the Related Art

Recently, there has been a demand for the development of a system for high-density wavelength optical communication to meet the requirement for increase in communication capacity in the optical communication technique. In a conventional wavelength division multiplexed (WDM) optical communication system, for example, light signals from a plurality of light sources are multiplexed by means of an optical coupler or a WDM coupler and transmitted by means of a single-core optical fiber. In this optical communication system, the light signals are transmitted separately for individual wavelengths on the transmission side, and light signals with specific wavelengths, branched by means of an optical demultiplexer, are received on the reception side.

According to this system, however, if the lasing wavelength of light emitted from any of the light sources shifts, for example, the light may possibly interfere with light from any other light source. Therefore, the respective lasing wavelengths of the light sources must be accurately adjusted to a constant value.

As a measure to attain this, there is a light wavelength tuning device that is described in Jpn. Pat. Appln. Publication No. 2546151.

Conventionally, however, an optical filter used in the light wavelength tuning device of this type is formed of a dielectric multilayered film, of which the wavelength characteristic depends much on temperature, so that wavelength tuning cannot be accurate enough.

In a conventional optical demultiplexer, however, the light wavelength tuning device serves only to keep the device temperature constant, and never to adjust the passing wavelength to a fixed value. If the wavelength of light transmitted through the optical demultiplexer shifts in the aforesaid WDM optical communication system of the high-density wavelength type, however, light with a desired wavelength cannot be transmitted, or light with any other wavelength may be transmitted. Possibly, therefore, degradation of transmission quality or transmission failure may occur.

Thus, if the control wavelength for the light wavelength tuning device for each optical device is subject to a substantial temperature error in the WDM optical communication system, degradation in transmission quality, such as a transmission error, is caused in the optical communication system.

A novel lasing wavelength fixing device is described in "Laser wavelength stabilization using holographic filters" (IEEE/LEOS meeting on optical networks and their enabling technologies, Jul. 11–13, 1994, Lake Tahoe, Nev.) by C. Malo, et al. In this device, the lasing wavelength of a laser is fixed by means of a crystal of lithium niobate ($LiNbO_3$) on which a grating is formed.

It is known, however, that the Bragg wavelength of the grating in this device has temperature dependence of 0.01 nm/° C. The crystal of lithium niobate is placed on a Peltier cooler, and is fitted with a thermistor for detecting temperature. Further, the device is expected to contain therein a lens for collimating light emitted from an optical fiber, beam splitter, condenser, and two photodiodes, thus entailing a complicated optical system. If this device is used, therefore, the device configuration is complicated and large-sized, so that the manufacturing cost is too high.

SUMMARY OF THE INVENTION

The present invention has been contrived in consideration of these circumstances, and its object is to provide a light wavelength tuning device capable of wavelength tuning with low temperature dependence.

Another object of the invention is to provide a light source having a simple construction and subject to less fluctuation in lasing wavelength.

Still another object of the invention is to provide an optical demultiplexer having a simple construction and subject to less fluctuation in passing wavelength.

A further object of the invention is to provide a WDM optical communication system subject to less degradation in transmission quality.

In order to achieve the first object, a light wavelength tuning device according to the present invention comprises: an optical filter for outputting part of light emitted from an optical device as wavelength tuning light by transmission or reflection, the output level of the wavelength tuning light varying with the change of the wavelength of the tuning light; and a wavelength tuner for tuning the wavelength of the light emitted from the optical device so that the output level of the wavelength tuning light delivered from the optical filter is approximate to a given value. The optical filter includes a fiber Bragg grating section provided with a wavelength stabilizer.

Thus, the passing wavelength characteristic of a fiber grating, which is believed originally to depend little on temperature, is prevented from further changing by means of the wavelength stabilizer. The wavelength of the optical device is tuned by means of the wavelength stabilizer, whereby the tuned wavelength is less liable to suffer an error that is attributable to the change of environmental temperature.

Further, the optical filter is formed by arranging two fiber Bragg grating sections with different Bragg wavelengths in series. The wavelength tuner tunes the wavelength of the light from the optical device so that the output level of the wavelength tuning light from the optical filter is approximate to a peak value between the respective Bragg wavelengths of the two fiber Bragg grating sections. Thus, the two fiber Bragg grating sections can be arranged in series by only forming two sets of gratings on one fiber, so that the construction is simple.

Furthermore, the optical filter is a resonator formed by arranging fiber Bragg grating sections in series. The wavelength tuner tunes the wavelength of the light from the optical device so that the output level of the wavelength tuning light from the optical filter is approximate to a peak value corresponding to the Bragg wavelength of the fiber Bragg grating sections. Thus, the two fiber Bragg grating sections can be arranged in series by only forming two sets of gratings on one fiber, so that the construction is simple.

The wavelength tuner tunes the wavelength of the light from the optical device so that the output level of the wavelength tuning light from the optical filter is approximate to a given level on a slope of a wavelength dependence curve of the fiber Bragg grating section. Thus, the light wavelength tuning device requires use of only one fiber Bragg grating section, so that its construction is simple. Since variation of voltage values corresponds to variation of wavelength in the wavelength tuner, moreover, tuning operation is easy.

Further, the optical filter causes one of branch beams of the light from the optical device to be transmitted or reflected as the wavelength tuning light by the fiber Bragg grating section having a given Bragg wavelength, and causes the other beam to be transmitted or reflected as reference light by a reference light pass section. The wavelength tuner tunes the wavelength of the light from the optical device so that a tuning voltage value, based on the difference between the output level of the wavelength tuning light delivered from the fiber Bragg grating section and the output level of the reference light delivered from the reference light pass section, is approximate to a given set voltage value. Thus, the branch light beam is used for the reference voltage value, so that an error that is attributable to variation of optical output can be canceled.

According to the invention, moreover, there is provided a light source including an automatic output controller, in which output light is partially used as wavelength tuning light and the temperature of an optical device is controlled by means of the aforesaid light wavelength tuning device. Having this simple construction, the light source can reduce fluctuation in lasing wavelength.

According to the invention, furthermore, there is provided an optical demultiplexer, which comprises: an input section for receiving wavelength division multiplexed light obtained by multiplexing light beams having a plurality of wavelengths; and an output section for dividing the wavelength division multiplexed light into a plurality of light beams for the individual wavelengths and outputting the beams. Any one of the light beams having any wavelength delivered from the output section is used as wavelength tuning light and the wavelength of the light delivered from the optical demultiplexer is tuned by means of the light wavelength tuning device according to any one of claims 1 to 5. Thus, in the optical demultiplexer, the temperature dependence of the passing wavelength is low. In this optical demultiplexer, an optical device that handles a plurality of light beams with different wavelengths, moreover, the pass level can be adjusted for all of its wavelengths by carrying out feedback control for light with one wavelength. In consequence, the optical demultiplexer can enjoy a simple construction.

According to the invention, moreover, there is provided a wavelength division multiplexed optical communication system, which comprises: a plurality of light sources for emitting light beams having different wavelengths; a multiplexed light transmission line for transmitting wavelength division multiplexed light obtained by multiplexing the light beams emitted from the light sources; the optical demultiplexer according to claim 7 whereby the wavelength division multiplexed light transmitted through the multiplexed light transmission line is received, divided into the light beams having the different wavelengths, and outputted; and a light receiver for receiving the individual light beams delivered from the optical demultiplexer. The output light of each of the light sources is partially used as wavelength tuning light, the wavelength of the output light being tuned by means of the light wavelength tuning device according to any one of claims 1 to 5. Thus, the light sources of this optical communication system are adjusted to their respective set wavelengths. Further, the optical demultiplexer serves to keep the wavelength of the light transmitted through the output section fixed. In the wavelength division multiplexed optical communication system, therefore, degradation in transmission quality can be lessened.

According to the invention, furthermore, there is provided a wavelength division multiplexed optical communication system, which comprises: a plurality of light sources for emitting light beams having different wavelengths; a multiplexed light transmission line for transmitting wavelength division multiplexed light obtained by multiplexing the light beams emitted from the light sources; the optical demultiplexer according to claim 7 whereby the wavelength division multiplexed light transmitted through the multiplexed light transmission line is received, divided into the light beams having the different wavelengths, and outputted; and a light receiver for receiving the individual light beams delivered from the optical demultiplexer. The light sources are arranged on one and the same temperature controlling device and the respective temperatures of the light sources are controlled collectively. Thus, the wavelength of each light source of this optical communication system can be kept fixed. Further, the optical demultiplexer serves to keep the wavelength of the light transmitted through the output section fixed. In the wavelength division multiplexed optical communication system, therefore, degradation in transmission quality can be lessened.

BRIEF DESCRIPTION OF THE DRAWINGS

FIG. 9 is a diagram for illustrating the respective transmission spectra of two FBG sections;

FIG. 10 is a diagram for illustrating a spectrum obtained by synthesizing the transmission spectra of the two FBG sections;

FIG. 17 is a top view showing a third example of the arrangement of the wavelength stabilizer;

FIG. 18 is a side view of the wavelength stabilizer shown in FIG. 17;

FIG. 26 is a diagram showing the relation between wavelength and a voltage signal from a current-voltage converter shown in FIG. 23;

FIG. 34 is a diagram showing an arrangement of an example of a WDM optical communication system according to the invention; and FIG. 35 is a diagram showing an arrangement of another example of the WDM optical communication system.

DESCRIPTION OF THE PREFERRED EMBODIMENTS

One embodiment of a light wavelength tuning device according to the present invention, and a light source, optical demultiplexer and wavelength division multiplexed optical communication system using the tuning device will now be described with reference to the accompanying drawings of FIGS. 1 to 35.

(Basic Mode)

Figure 1:
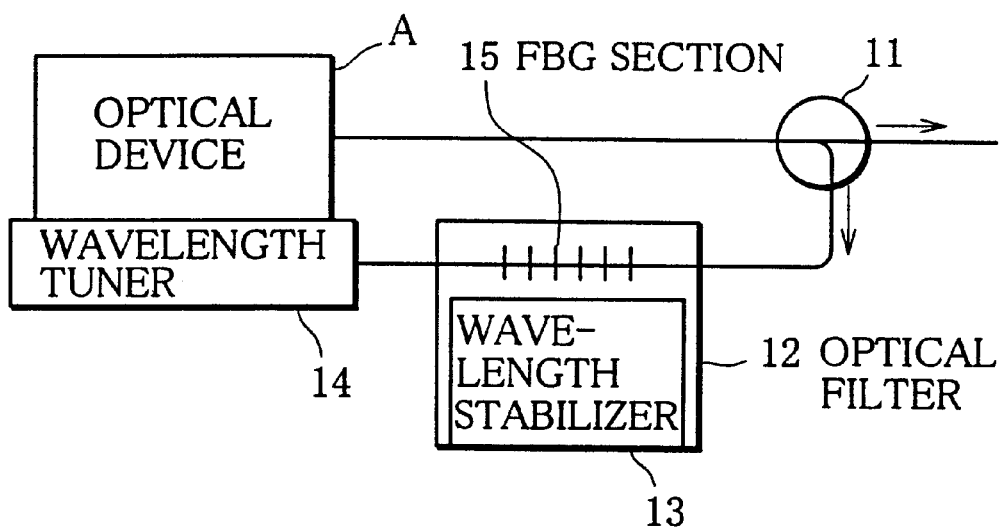
FIG. 1 is a diagram showing the basic mode of a light wavelength tuning device according to the present invention.

FIG. 1 is a diagram showing the basic mode of a light wavelength tuning device according to the present invention. According to the invention, as shown in FIG. 1, light emitted having a desired wavelength from an optical device A is partially branched as wavelength tuning light by means of an optical coupler 11 and applied to an optical filter 12. The filter 12 includes a fiber Bragg grating (FBG) section 15, which is composed of a grating formed on an optical fiber core. In the FBG section 15, the pass level of the wavelength tuning light is changed with the change of the wavelength thereof as it is outputted. The Bragg wavelength of the FBG section 15 normally has the temperature dependence of 0.01 nm/° C., which is not very high. This value represents a very small variation by 0.1 nm for each change of 10° C., for example.

If the optical filter 12 is used in a high-density wavelength division multiplexed optical communication system in a 1.55-$\mu$m band, for example, however, the ITU-recommended value of the wavelength of adjacent light signals in this communication system is 100 GHz (≈0.8 nm). Thus, a slight wavelength shift that is caused by temperature change can result in degradation of transmission signals. Accordingly, the optical filter 12 is provided with a wavelength stabilizer 13, which prevents the wavelength characteristic of the wavelength tuning light from changing depending on the ambient temperature or the like. In the wavelength tuner 14 according to the invention, the wavelength tuning light transmitted through the optical filter 12 is subjected to optical-to-electrical conversion to obtain a voltage value corresponding to its pass level. Based on this voltage value, moreover, the wavelength tuner 14 obtains a tuning voltage value, and tunes the wavelength of the light from the optical device A so that the tuning voltage value is approximate to a set voltage value corresponding to the a set wavelength for the device A.

Thus, according to the basic mode of the invention, the wavelength tuning of the optical device A is carried out after the wavelength characteristic is prevented from further changing by attaching the wavelength stabilizer 13 to the optical filter 12 that includes the FBG section 15 of which the passing wavelength characteristic is believed originally to depend little on temperature. Thus, the tuned wavelength is less liable to suffer an error that is attributable to the change of environmental temperature, so that the temperature dependence of the wavelength tuning operation can be lowered.

The following is a detailed description of the optical filter 12. The Bragg wavelength of the grating formed in the FBG section 15 has a temperature characteristic for the following reason, although it is better than that of a dielectric multi-layered film. The optical fiber extends in the longitudinal direction as silica, the material of the FBG section having a thermal expansion coefficient, expands. As this is done, the pitch of the grating lengthens, so that a wavelength shift is caused. This relation can be expressed as follows:

$$(d\lambda_B/dT) = 2\Lambda\{(dn/dT) + n\alpha\},$$

where $\lambda_B$ is the Bragg wavelength. Thus, $d\lambda_B/dT$ represents the temperature dependence of the Bragg wavelength. $\Lambda$ is the pitch of the grating.

Normally, silica that is used for the core of the FBG section 15 is doped with germanium. The temperature dependence of its refractive index is given by $(dn/dT) = 1.1 \times 10^{-5}/°$ C., where n is the refractive index of the core of the FBG section 15, which is about 1.46. Further, $\alpha$ is a thermal expansion coefficient of $5.2 \times 10^{-7}/°$ C. Thus, the temperature dependence of the Bragg wavelength in the FBG section is at 0.01 nm/° C. or thereabout.

The Bragg wavelength can be changed by the application of stress. If stress is applied in the direction to extend the optical fiber in the longitudinal direction, the pitch of the grating becomes longer, so that the Bragg wavelength moves to the longer side. If stress is applied in the direction to contract the optical fiber, on the other hand, the pitch of the grating becomes shorter, so that the Bragg wavelength shortens.

Thus, the FBG section 15 has a temperature characteristic such that the Bragg wavelength becomes longer with increase of temperature and its changing rate is fixed at about 0.01 nm/° C. If stress is applied in the direction opposite to the direction to extend the FBG section 15 as the temperature increases, therefore, the change of the Bragg wavelength can be canceled, so that the optical filter 12 can be a filter that is low in temperature dependence. The wavelength stabilizer 13 is based on this principle.

Figure 2:
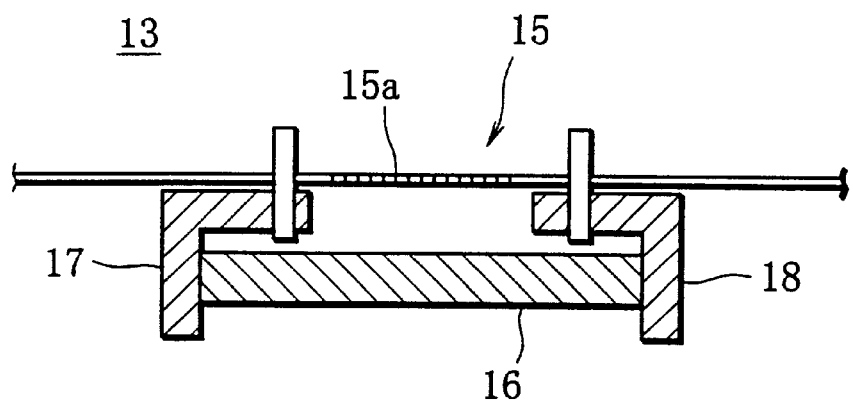
FIG. 2 is a sectional view showing a specific arrangement of a first example of a wavelength stabilizer shown in FIG. 1.

FIG. 2 is a sectional view showing a specific arrangement of a first example of the wavelength stabilizer 13 shown in FIG. 1. Referring now to FIG. 2, there is shown a grating 15a that is formed in the FBG section 15. The wavelength stabilizer 13 includes an invar rod 16 and fixtures 17 and 18. More specifically, the fixtures 17 and 18, which are formed of aluminum ($\alpha=2.5 \times 10^{-5}/°$ C.) or stainless steel ($\alpha=1.7 \times 10^{-5}/°$ C.), are attached individually to the opposite ends of the invar rod 16. Each fixture has an L-shaped profile. An end portion of the rod 16 is attached to one end portion of each fixture, and the FBG section 15 is attached to the other end portion of each fixture. The FBG section 15 and the invar rod 16 have substantially equal thermal expansion coefficients, while the fixtures 17 and 18 have a higher thermal expansion coefficient.

If the ambient environmental temperature increases in the optical filter 12 constructed in this manner, the FBG section 15 and the invar rod 16 are urged to extend with substantially the same thermal expansion characteristic. If the fixtures 17 and 18 with the higher thermal expansion coefficient undergo thermal expansion, on the other hand, stress is generated in the direction to contract the optical fiber, so that the change of the Bragg wavelength of the grating 15a can be canceled. The fixtures 17 and 18 are previously adjusted to a length such that the elongation of the FBG section 15 and the invar rod 16 attributable to their thermal expansion characteristic can be canceled within the range of working environmental temperature.

Figure 3:
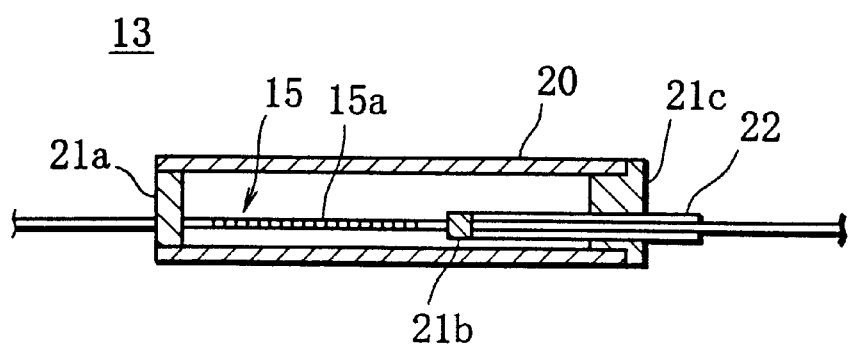
FIG. 3 is a sectional view of a second example similar to FIG. 2.

FIG. 3 is a sectional view of a second example of the wavelength stabilizer 13. In the description to follow, like reference numerals are used to designate like components throughout the drawings for simplicity of illustration.

In the second example shown in FIG. 3, the wavelength stabilizer 13 is composed of a silica tube 20, stainless-steel tube 22, and epoxy resins 21a, 21b and 21c. An FBG section 15 is located in the silica tube 20 and fixed to the silica tube 20. More specifically, the FBG section 15 is fixed to the epoxy resin 21a, which is fixed in the silica tube 20, on one side of the tube 20. On the other side of silica tube 20, the FBG section 15 is fixed in the stainless-steel tube 22 by means of the epoxy resin 21b, and the tube 22 is fixed to the resin 21c. The optical filter 12 is obtained by fixing the resulting structure to the silica tube 20.

When the ambient environmental temperature increases in the FBG section 15 and the wavelength stabilizer 13 constructed in this manner, the FBG section 15 and the silica tube 20 are urged to expand with characteristics based on the same thermal expansion coefficient. On the other hand, the stainless-steel tube 22 undergoes thermal expansion with a characteristic based on a higher thermal expansion coefficient, and applies stress to the FBG section 15. Thus, the elongation of the FBG section 15 attributable to its thermal expansion characteristic can be canceled, so that the change of the Bragg wavelength can be canceled.

Figure 4:
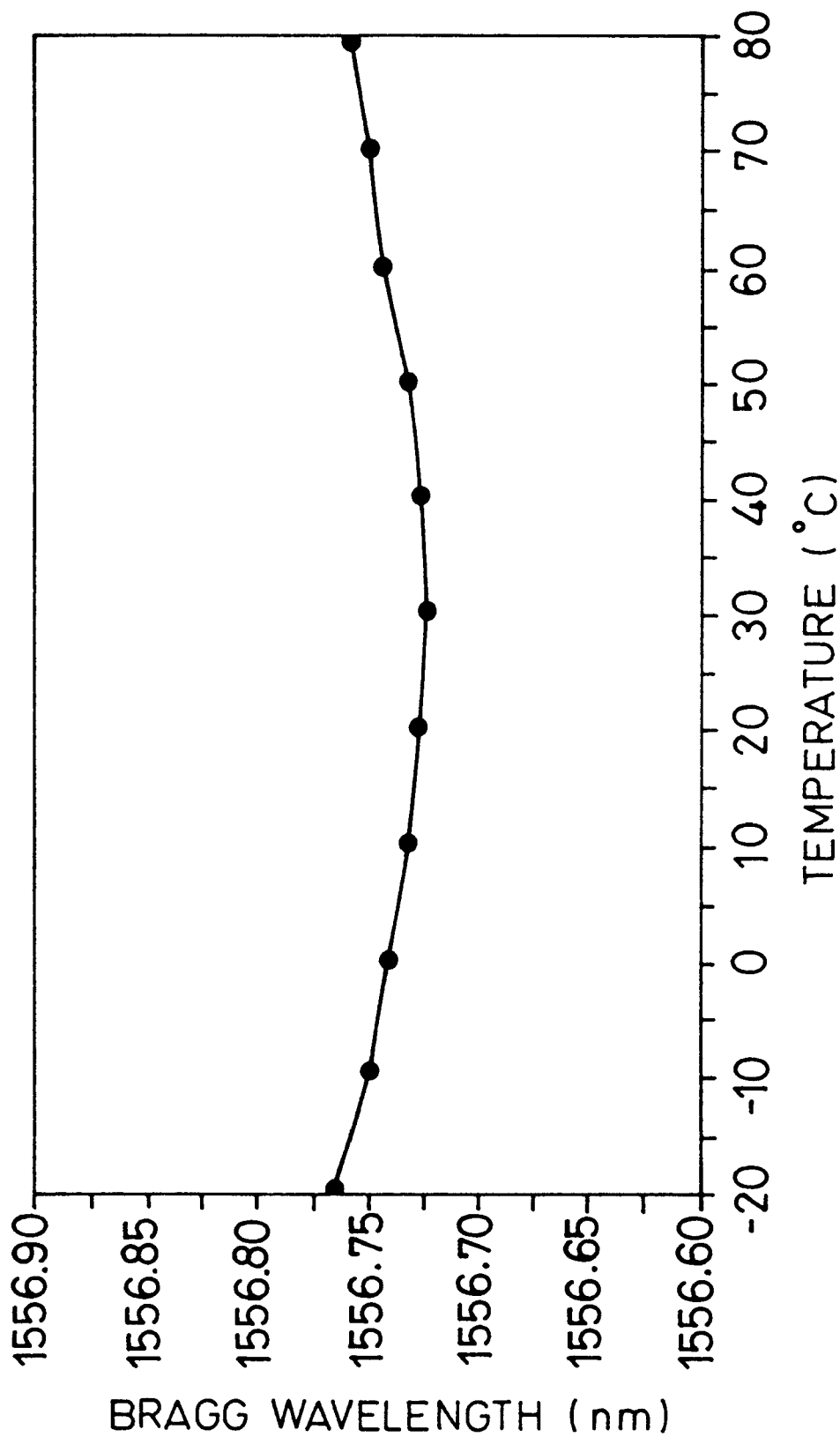
FIG. 4 is a diagram showing an example of the relation between the varying temperature and Bragg wavelength of an FBG section.

A temperature compensation package in which the wavelength stabilizer 13 is attached to the FBG section 15 to ensure temperature compensation is described in "Technical Digest of OFC '95" (WI4, pp. 134–135, 1995) by C. W. Yoffe, et al., for example, FIG. 4 is a diagram showing an example of the relation between the temperature of the FBG section 15 shown in FIG. 2 and the change of the Bragg wavelength. In the temperature range from –20° C. to 80° C., as shown in FIG. 4, the Bragg wavelength changes within a range of 0.05 nm, and a stable wavelength characteristic can be enjoyed without carrying out electric temperature control.

Thus, according to the wavelength stabilizer 13 of this example, stress is applied to the FBG section 15 to cancel the change of its wavelength, so that the Bragg wavelength can be fixed with use of a simple construction. In consequence, the wavelength of the light that passes through the FBG section 15 is further stabilized, so that a desired lasing wavelength can be obtained even when a laser light source is run for hours, for example.

Figure 5:
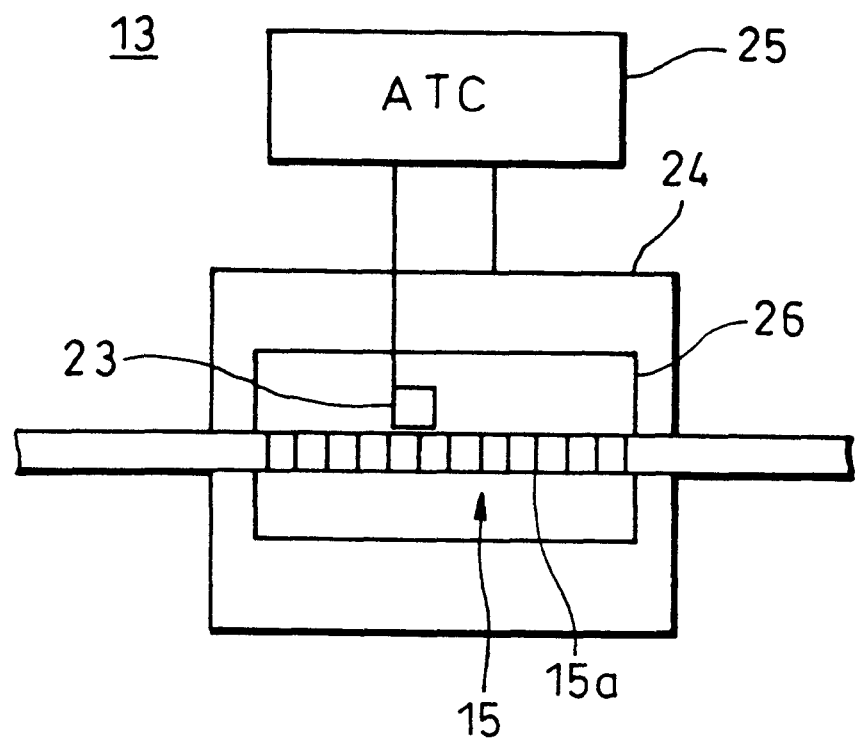
FIG. 5 is a diagram showing a specific arrangement of a third example of the wavelength stabilizer.

The wavelength stabilizer 13 may be designed to fix the Bragg wavelength by electrically controlling the temperature of the FBG section 15. FIG. 5 shows an arrangement of a third example of the wavelength stabilizer 13. An FBG section 15 is fitted with a thermistor 23 and a Peltier cooler 24. Based on temperature detected by the thermistor 23, an automatic temperature controller (ATC) 25 drivingly controls the Peltier cooler 24, thereby regulating the temperature of the FBG section 15. The FBG section 15 is steadily fixed to a V-groove of a fixture 26 that is placed on the Peltier cooler 24, for example.

Thus, according to this example, the Bragg wavelength of a grating 15a can be fixed by stabilizing the temperature of the FBG section 15.

According to this example, therefore, the temperature of the grating can be kept constant by electrical adjustment. Accordingly, the transmission spectrum of the grating is constant, so that the lasing wavelength of an optical device, e.g., a laser light source, can be fixed at a desired value, thus ensuring the same effects of the first and second examples.

Another example of the wavelength stabilizer 13 will be described in connection with a first embodiment. In the description to follow, the wavelength stabilizer 13 is any of the aforementioned examples, unless otherwise stated, whereby the Bragg wavelength of the FBG section 15 is fixed.

First Embodiment

Figure 6:
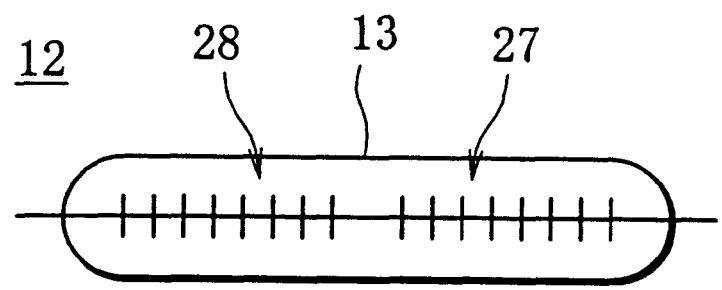
FIG. 6 is a diagram showing a configuration in which two FBG sections having different Bragg wavelengths are arranged in series.

According to this embodiment, the optical filter 12 has a notch-type transmission wavelength-level characteristic and includes two FBG sections 27 and 28 with different or equal Bragg wavelengths that are arranged in series, as shown in FIG. 6, for example. The wavelength stabilizer 13 is used to stabilize its wavelength characteristic.

Figure 7:
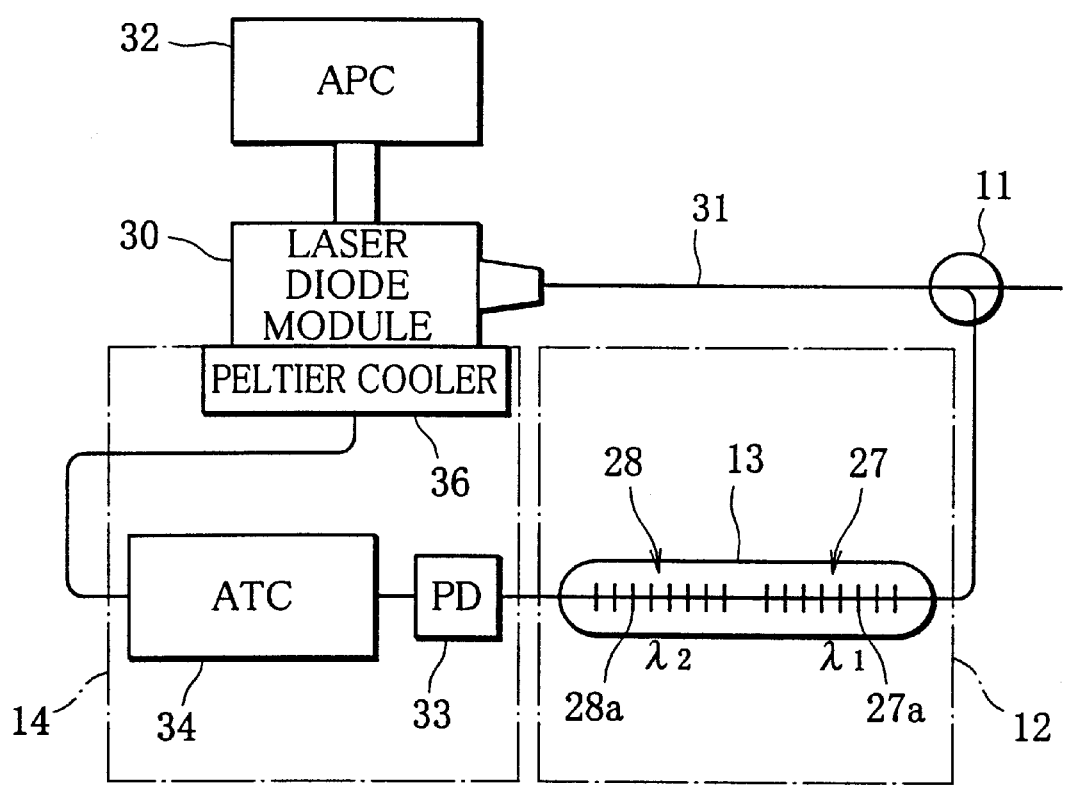
FIG. 7 is a diagram showing an arrangement of a first example of a light wavelength tuning device for an optical device according to the invention.

FIG. 7 is a diagram showing a first example of the light wavelength tuning device for the optical device according to the invention that includes the optical filter 12 shown in FIG. 6. According to this example, as shown in FIG. 7, a laser, such as a distribution-feedback (DFB) laser, is used as the optical device according to the invention. The light wavelength tuning device comprises a laser diode module 30 including the laser, an optical coupler 11, an optical filter 12, a wavelength tuner 14, and an automatic power controller (APC) 32. The coupler 11 serves to branch light signals that propagate through a pigtail optical fiber 31, an optical transmission line on the optical path of the laser diode module 30. The filter 12, which includes FBG sections 27 and 28, fetches the branch wavelength tuning light. The tuner 14 tunes the wavelength of light emitted from the laser of the laser diode module 30 in accordance with the light transmitted through the optical filter 12. The APC 32 controls the injection current of the laser.

The wavelength tuner 14 is composed of a photodiode 33, an ATC 34, and a Peltier cooler 36. The photodiode 33 detects the wavelength tuning light transmitted through the optical filter 12 and subject it to optical-to-electrical conversion. The ATC 34 regulates current supplied to the cooler 36, thereby controlling the temperature of the laser.

Figure 8:
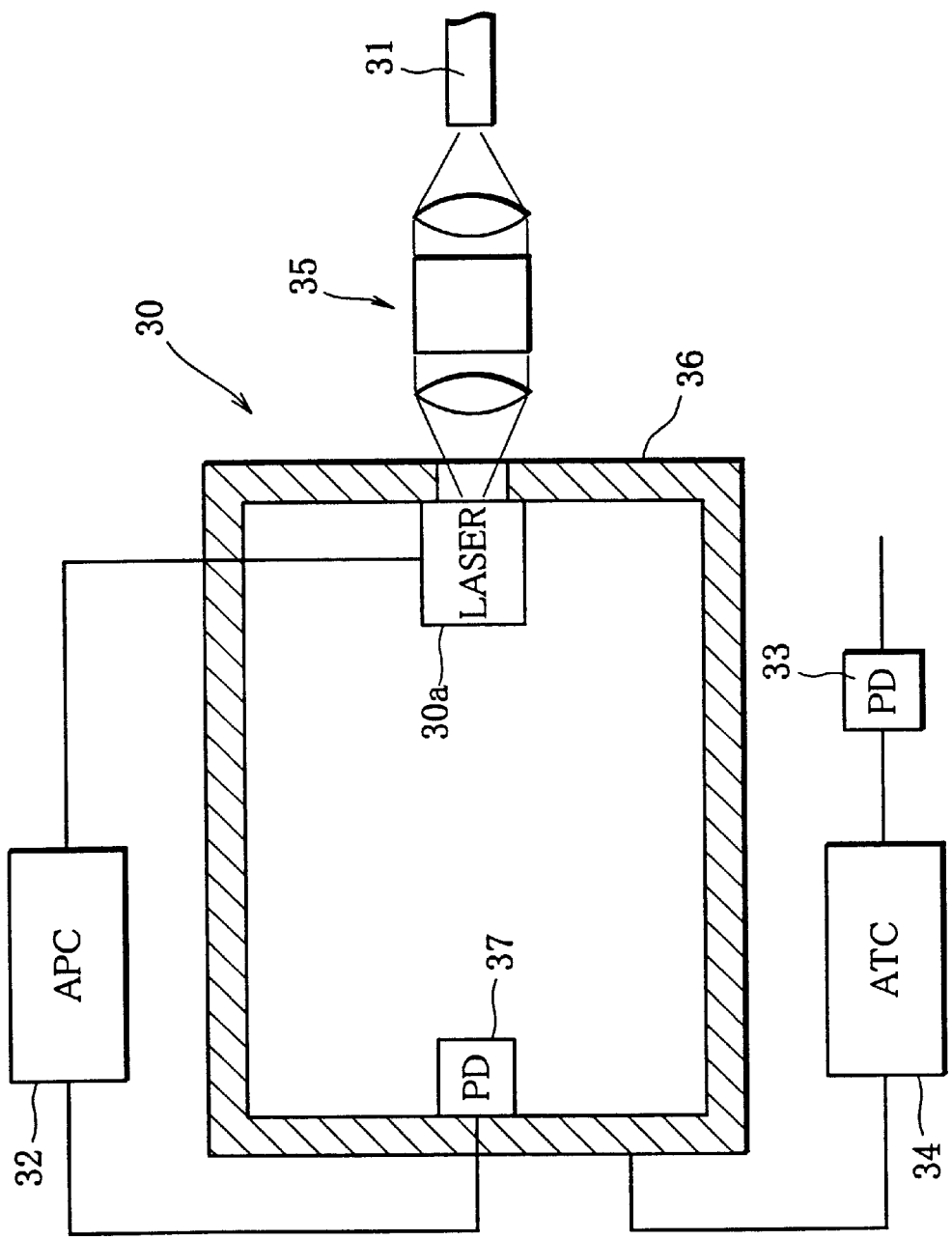
FIG. 8 is a diagram showing an arrangement of a laser diode module shown in FIG. 1.
Figure 11:
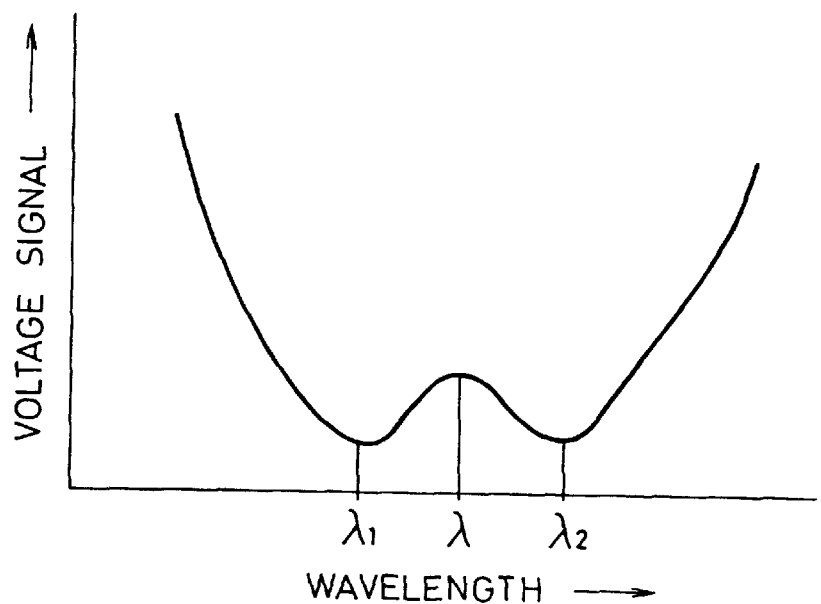
FIG. 11 is a diagram showing the relation between a voltage signal and wavelength corresponding to light transmitted through the FBG sections.

As shown in FIG. 8, the laser diode module 30 is composed of a laser 30a and a photodiode 37. The laser 30a delivers a light signal with a given lasing wavelength to the pigtail optical fiber 31 through an optical system 35, which is formed of an optical isolator or lens. The photodiode 37 detects light emitted from the rear surface of the laser 30a and subjects it to optical-to-electrical conversion. Based on output voltage from the photodiode 37, the APC 32 controls the injection current of the laser 30a.

As shown in FIGS. 7 and 8, optical output from the laser 30a is branched from the pigtail optical fiber 31 by the optical coupler 11. One branch output propagates as a light signal through the transmission line, while the other is applied as the wavelength tuning light to the optical filter 12.

The optical filter 12 is provided with the FBG sections 27 and 28 including their respective gratings 27a and 28a and the wavelength stabilizer 13, and reflects light waves around the Bragg wavelength. The reflection spectra of the FBG sections 27 and 28 depend on the diffraction grating intervals and refractive index changes of the gratings 27a and 28a. According to this example, the respective Bragg wavelengths of the two FBG sections 27 and 28 are approximated. FIG. 9 shows the respective transmission spectra of the two FBG sections 27 and 28 formed on a fiber. In FIG. 9, $\lambda_1$ and $\lambda_2$ are the Bragg wavelengths of the FBG sections 27 and 28, respectively, and $\lambda$ is the wavelength at the point of intersection of the respective transmission spectra of the FBG sections. If the respective wavelength characteristics of the two gratings are substantially equal, and if their peak reflectance and full width half maximum are substantially equal, the wavelength $\lambda$ is substantially intermediate between $\lambda_1$ and $\lambda_2$. If these two transmission spectra are synthesized, therefore, a notch-type characteristic is exhibited centering on the wavelength $\lambda$, as shown in FIG. 10. Thus, the optical filter 12 is a notch-type transmission optical filter. The relation between the Bragg wavelengths $\lambda_1$ and $\lambda_2$ is given by $\lambda_1 < \lambda_2$.

First, the ATC 34 regulates the current supplied to the Peltier cooler 36 so that the lasing wavelength of the laser 30a is longer than $\lambda_1$ and shorter than $\lambda_2$, and then carries out automatic temperature control. The light transmitted through the optical filter 12 is detected by the photodiode 33 and converted into a voltage signal having a characteristic shown in FIG. 11. In the ATC 34 of this example, the temperature of the laser 30a is controlled by regulating the current to be injected into the Peltier cooler 36 so that the obtained voltage signal takes the maximum value within the range from $\lambda_1$ to $\lambda_2$.

Thus, according to this example, the temperature of the laser is controlled so that the wavelength of the light that passes through the optical filter 12 takes the maximum value within the range of the two Bragg wavelengths. In consequence, the lasing wavelength of the laser is stabilized, and the wavelength of the transmitted light is fixed, so that a desired lasing wavelength can be obtained even after prolonged drive. In the case where the light wavelength tuning device of this example is used in a high-density wavelength division multiplexed optical communication system, for example, degradation of transmission signals attributable to wavelength shifts can be prevented, so that the reliability of the transmission quality can be improved.

In this example, moreover, there is no need of a temperature sensor for detecting the temperature of the laser, so that the manufacturing cost of the laser diode module can be reduced.

Since the FBG sections 27 and 28 can be obtained by forming the two gratings 27a and 28a on one optical fiber, furthermore, the construction of the optical filter 12 can simplified.

In this example, moreover, the wavelength tuning light is applied to the optical filter 12 after it is branched by means of the optical coupler 11. The present invention is not, however, limited to this arrangement. For example, the FBG sections 27 and 28 of the invention may be arranged on a pigtail optical fiber. In this case, the light transmitted through the FBG sections 27 and 28 is applied to the wavelength tuner 14 after it is branched by means of the optical coupler 11. Thus, the lasing wavelength of the laser 30a can be stabilized in the same manner as in the case of the first example.

According to this example, furthermore, the FBG sections 27 and 28 are connected in series with each other. However, the invention is not limited to this arrangement. For example, wavelength tuning lights may be transmitted individually through the FBG sections 27 and 28 and converted into electrical signals, which should be synthesized. Alternatively, reflection spectra of the Bragg wavelengths from those gratings may be synthesized.

Figure 12:
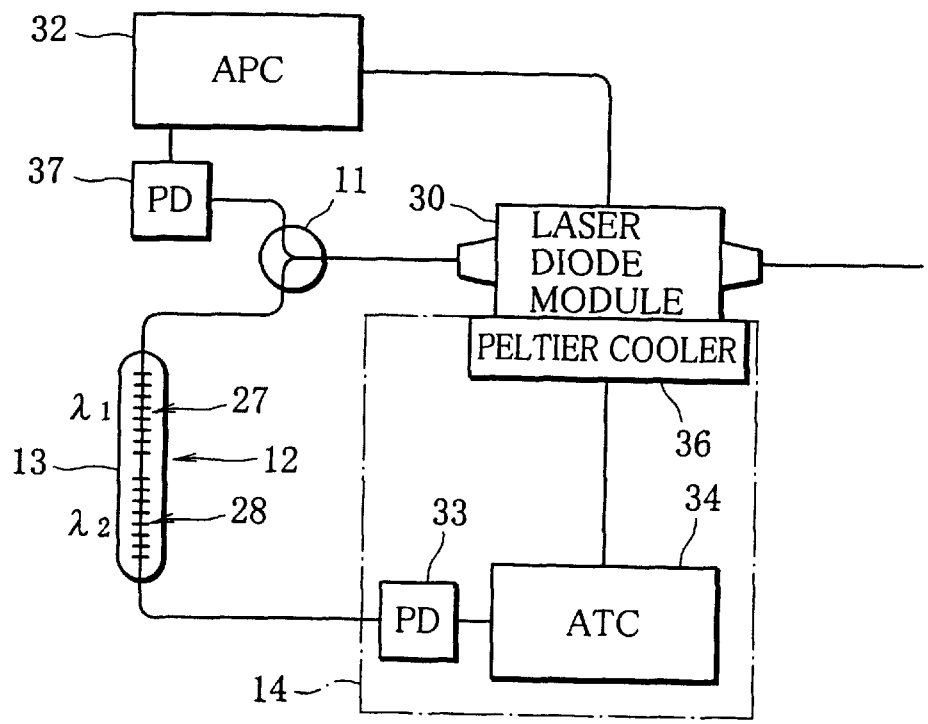
FIG. 12 is a diagram showing an arrangement of a second example of the light wavelength tuning device for the optical device according to the invention.

FIG. 12 is a diagram showing an arrangement of a second example of the light wavelength tuning device in which optical output is fetched from the rear surface of the laser. In the description to follow, like reference numerals are used to designate like components throughout the drawings for simplicity of illustration.

Referring now to FIG. 12, there is shown an APC 32 according to this example, which drivingly controls a laser. A photodiode 37 is used to monitor optical output from a laser diode module 30. In this example, therefore, the optical output from the rear surface of the laser is taken out of the laser diode module 30 by means of a pigtail optical fiber on its optical path, and is branched by means of an optical coupler 11. One branch light beam is transmitted through the photodiode 37 to be used for controlling the APC 32. The other branch beam is applied to an optical filter 12, transmitted through two FBG sections 27 and 28 whose wavelength characteristics are stabilized by means of a wavelength stabilizer 13, and converted into a voltage signal by means of a photodiode 33. In the ATC 34, the temperature of the laser is controlled by regulating current to be injected into a Peltier cooler 36 so that the obtained voltage signal takes the maximum value within the range from $\lambda_1$ to $\lambda_2$.

Thus, according to this example, the optical output is fetched from the rear surface of the laser, and the temperature of the laser is controlled so that the wavelength of the light that passes through the FBG sections takes the maximum value within the range of the two Bragg wavelengths.

In consequence, as in the case of the first example, the lasing wavelength of the laser is stabilized, and the wavelength of the light transmitted through each FBG section is fixed, so that a desired lasing wavelength can be obtained even after prolonged drive.

Figure 13:
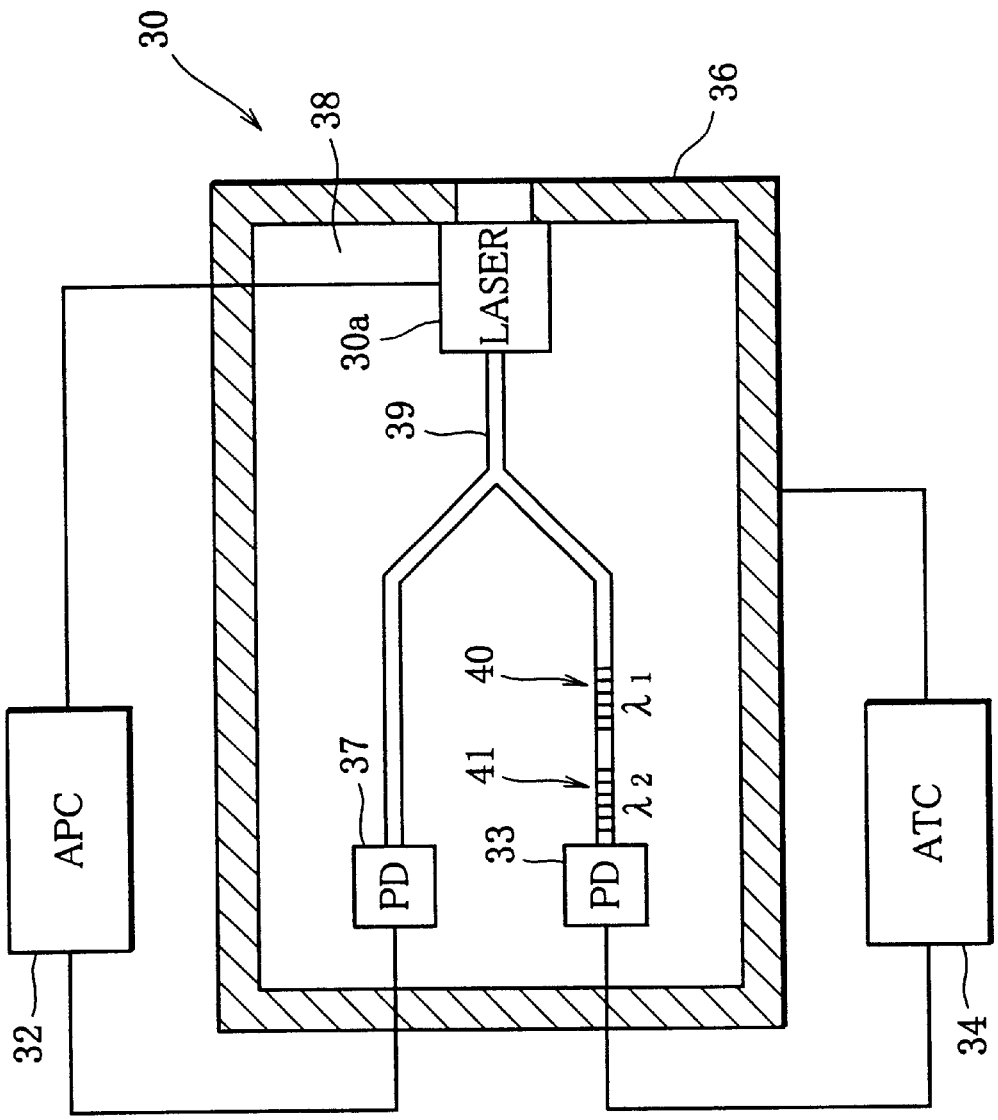
FIG. 13 is a diagram showing an arrangement of a third example of the light wavelength tuning device.

One unit may be formed combining the respective functions of the laser diode module 30, optical filter 12, photodiodes 33 and 37, and optical coupler 11 shown in FIG. 12. As shown in FIG. 13, for example, a laser 30a is fixed on a silicon substrate 38, and a rear facet of the laser 30a and a waveguide 39 of silica are directly connected without using an optical system. The waveguide 39 is bifurcated into two branch lines. One branch line is coupled to the photodiode 37 that is connected to the APC 32. The other branch line is coupled to the photodiode 33 through two FBG sections 40 and 41 that are formed on the silica waveguide 39. Thus, based on the principle described in connection with the second example, the ATC 34 controls the temperature of the laser 30a by regulating the current to be injected into the Peltier cooler 36 with use of the signal detected by the photodiode 33.

According to this third example, the same effects of the first example can be obtained, and besides, all the components of the light wavelength tuning device according to the invention can be incorporated in one unit, so that the device can be reduced in size and weight. Since the Peltier cooler 36 functions as a wavelength stabilizer for stabilizing the wavelength characteristics of the FBG sections 40 and 41, moreover, there is no necessity for providing any separate wavelength stabilizer.

The following a description of an example of the wavelength stabilizer 13 shown in FIGS. 6 to 12.

Figure 14:
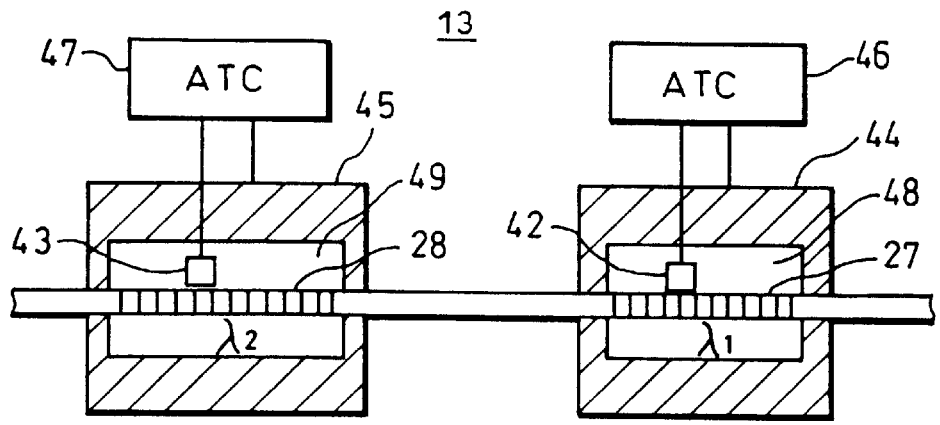
FIG. 14 is a top view showing a first example of an arrangement of a wavelength stabilizer used in the invention.
Figure 15:
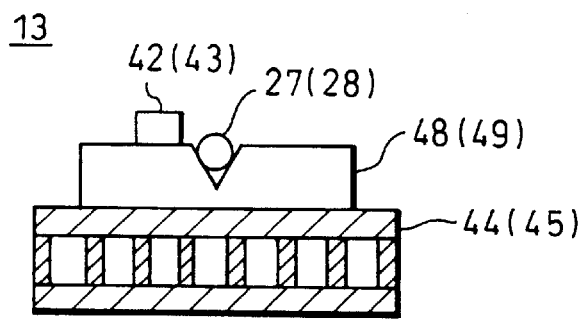
FIG. 15 is a side view of the wavelength stabilizer shown in FIG. 14.

In the example shown in FIGS. 14 and 15, the FBG sections 27 and 28 are fitted with thermistors 42 and 43 and Peltier coolers 44 and 45, respectively. Based on temperatures detected by the thermistors 42 and 43, ATCs 46 and 47 drivingly controls the Peltier coolers 44 and 45 to adjust the temperatures of the FBG sections 27 and 28 to fixed values. The respective optical fibers of the FBG sections 27 and 28 are steadily fixed to V-grooves of fixtures 48 and 49 that are placed on the Peltier coolers 44 and 45, respectively.

Thus, according to this example, the wavelength characteristics of the respective gratings of the two FBG sections 27 and 28 can be stabilized by stabilizing the temperatures of the FBG sections.

Figure 16:
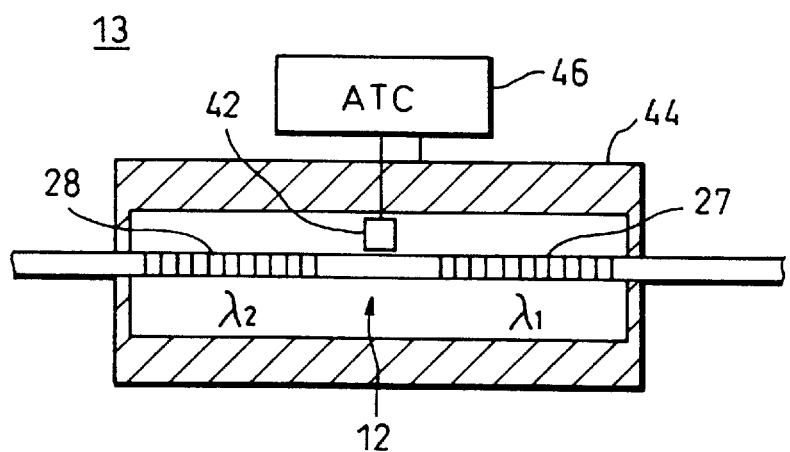
FIG. 16 is a top view showing a second example of the arrangement of the wavelength stabilizer.

In a second example of the wavelength stabilizer 13 shown in FIG. 16, two FBG sections 27 and 28 are placed on one Peltier cooler 44. An ATC 46 can be constructed so that it can regulate the temperature of the stabilizer 13 by drivingly controlling the Peltier cooler 44 in accordance with temperature detected by the thermistor 42. In this case, as in the case of the foregoing examples, the lasing wavelength of the optical device can be fixed at a desired value and the number of components can be reduced by fixing the temperatures of the FBG sections 27 and 28.

It is known that an FBG section changes its Bragg wavelength also when it is subjected to stress. In a third example of the wavelength stabilizer 13 shown in FIGS. 17 and 18, FBG sections 27 and 28 are stored in a package 50 that can fully cut off external stress. Arranged in the package 50, moreover, are fixtures 53 and 54 that fix an optical fiber, which forms the FBG sections 27 and 28, to insert-holes 51 and 52 of the package 50 lest the optical fiber be stressed in its longitudinal direction. Furthermore, a fixture 55 having a V-groove is located in the package 50 to fix the FBG sections 27 and 28 lest the FBG sections bend.

Thus, the FBG sections 27 and 28 are arranged so as not be externally stressed, so that the Bragg wavelength can be kept fixed to fix the lasing wavelength of the laser light source to the desired value.

Figure 19:
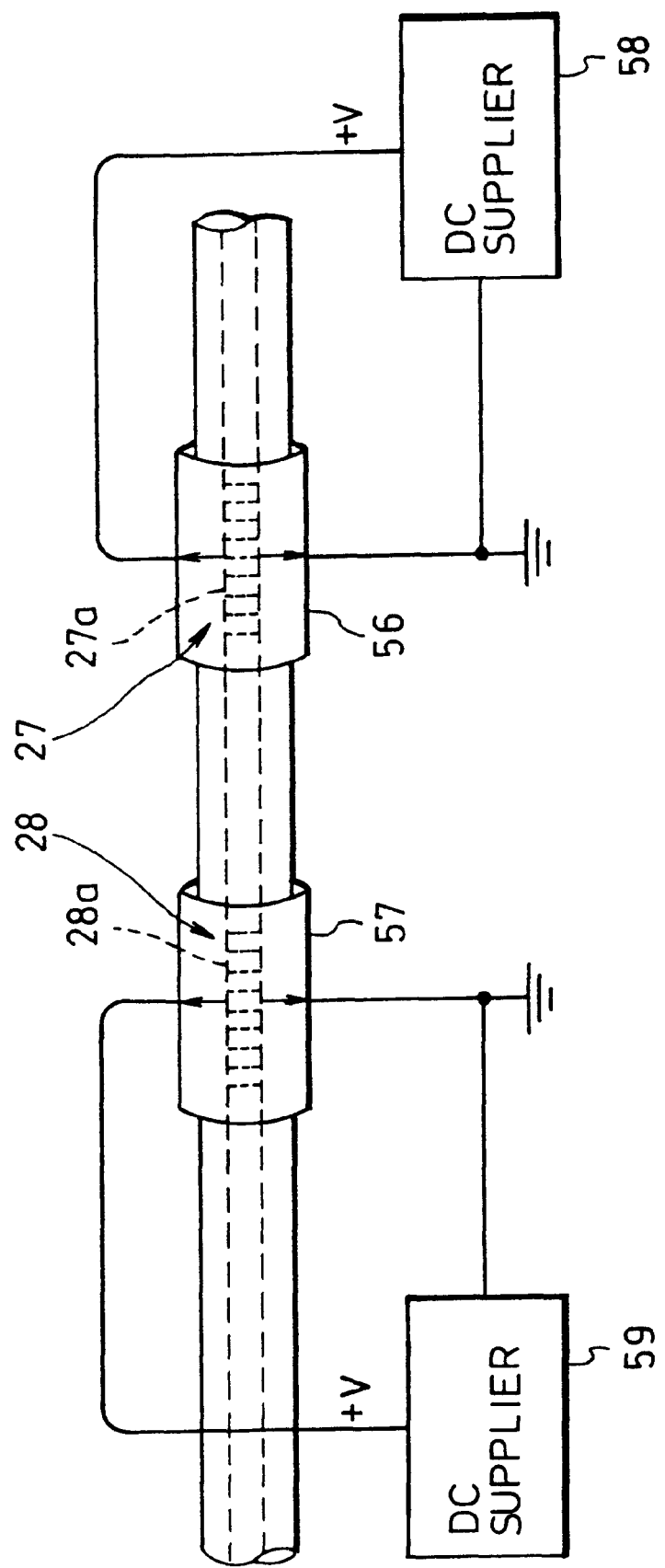
FIG. 19 is a top view showing a fourth example of the arrangement of the wavelength stabilizer.

FIG. 19 shows a fourth example of the wavelength stabilizer 13, in which cylindrical piezoelectric devices 56 and 57 are mounted on the outer peripheral surfaces of gratings 27a and 28a of FBG sections 27 and 28, respectively, by utilizing the characteristic of the Bragg wavelength of each FBG section to change depending on stress. A voltage V from DC suppliers 58 and 59 is applied to the piezoelectric devices 56 and 57 to actuate them, and stress is applied vertically to the gratings 27a and 28a.

According to this example, therefore, stress that acts on the FBG sections 27 and 28 can be changed by changing the applied voltage from the DC suppliers. Thus, the FBG sections extend or contract in the vertical direction, so that the respective Bragg wavelengths of the gratings 27a and 28a change, and the lasing wavelength can be changed and adjusted to the desired value.

Figure 20:
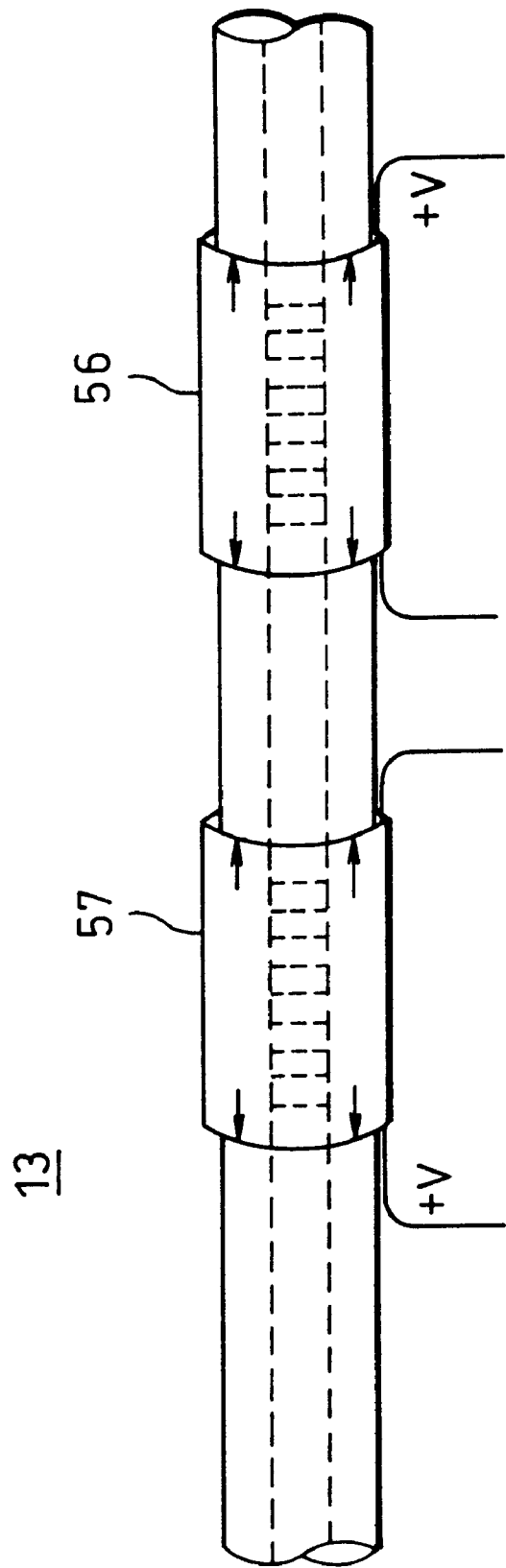
FIG. 20 is a top view showing a fifth example of the arrangement of the wavelength stabilizer.

FIG. 20 shows an arrangement in which the crystal of the piezoelectric devices shown in FIG. 19 is shifted for 90°. Also in this fifth example of the wavelength stabilizer 13, a voltage V from DC suppliers (not shown) is applied to piezoelectric devices 56 and 57 to actuate them. Thus, according to this example, longitudinal stress on gratings changes, so that the Bragg wavelengths can be stabilized.

In the device according to the present invention, as described above, the desired lasing wavelength is obtained with use of the FBG sections in which the gratings with different Bragg wavelengths are connected in series, whereby the optical filter having a notch-type transmission wavelength-level characteristic is formed. Alternatively, according to the invention, FBG sections may be formed of resonators, such as fiber grating Fabry-Perot filters that include gratings having the same regular pitches and transmit narrow-band light.

Figure 21:
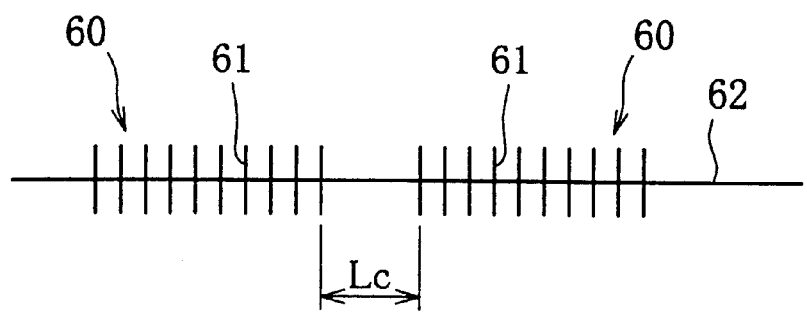
FIG. 21 is a diagram showing another example of the arrangement of the FBG sections in the first to third examples of the light wavelength tuning device according to the invention.

The following is a description of a $\pi/2$ phase-shift fiber grating Fabry-Perot filter according to this example. As shown in FIG. 21, FBG sections 60 are formed including gratings 61 that are arranged at regular spaces on a core of an optical fiber 62. In the FBG sections 60, a blank with a length $L_c$ is provided between the gratings 61. Thus, the FBG sections 60 constitute a Fabry-Perot resonator. The Bragg wavelength ($\lambda_B$) of each grating 61 is given by $$\lambda_B = 2n_{av}\Lambda,$$

where $\Lambda$ is the period of the grating, and $n_{av}$ is the average refractive index of the fiber core (not shown) on which the grating is formed. The transmittance (T) of this fiber grating Fabry-Perot filter is given by $$T = 1/\{1 + 4|f_{11}|^2|f_{12}|^2\cos^2(\beta L_c + \phi)\},$$

where we have $f_{11} = \cosh(\gamma z) - j(\delta/\gamma)\sinh(\gamma z),$
$f_{12} = -(\kappa/\gamma)\sinh(\gamma z),$
$\phi = \tan^{-1}\{(\delta/\gamma)\tanh(\gamma L)\},$
$\kappa = \pi\Delta n/\lambda,$
$\gamma = \sqrt{(\kappa^2 - \delta^2)}$
$\delta = 2n_{av}\pi\{(1/\lambda) - (1/\lambda_B)\}.$ Here $\beta$ is a propagation constant, which is given by $\beta = 2\pi n_{av}/\lambda$.

When the transmittance T is 1, it takes its maximum value. Theoretically, in this state, light passes through the filter without a loss. The center of the filter has the Bragg wavelength $\lambda_B$. As seen from the above expression for transmittance, the transmittance takes its maximum value when we have $\cos(\beta L_c + \phi) = 0$. Since $\phi = 0$ is given for the Bragg wavelength, only the following relation is needed:

$$\beta L_c = (m + \tfrac{1}{2})\pi,$$

where m=1, 2, 3 . . .

Thus, the resonator length $L_c$ of the Fabry-Perot resonator should only be given by $$L_c = (m + \tfrac{1}{2})\Lambda.$$

Substituting this condition into the aforesaid expression for the transmittance T, we obtain $$T = 1/[1 + 4|f_{11}|^2|f_{12}|^2 \cos^2\{(m+\tfrac{1}{2})\pi\lambda_B/\lambda + \phi\}].$$

Figure 22:
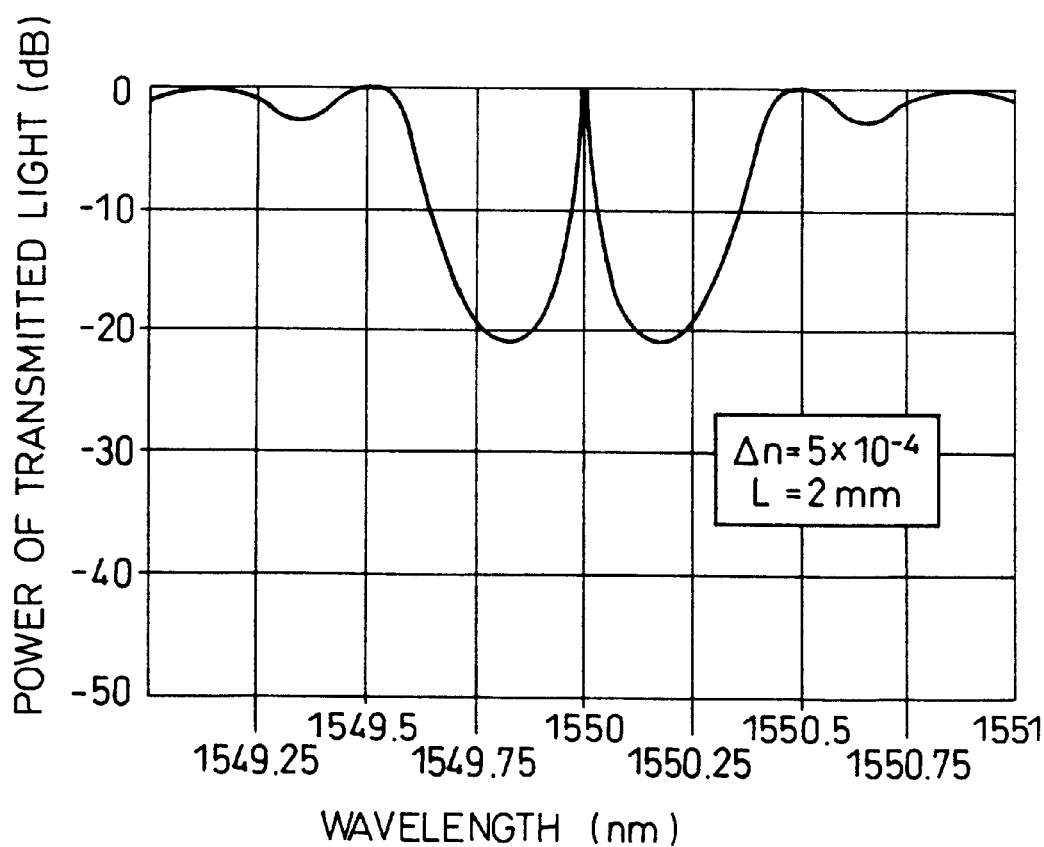
FIG. 22 is a diagram for illustrating the respective transmission spectra of gratings shown in FIG. 21.

The relation between transmitted light and wavelength shown in FIG. 22 can be obtained by calculating this expression with use of the Bragg wavelength $\lambda_B$ at 1,550 nm, refractive index change $\Delta n$ at $5 \times 10^{-4}$, length of the gratings 61 at 2 mm.

Thus, according to this example, the FBG sections 60 are formed from the gratings 61 with equal Bragg wavelengths at regular spaces, in place of the two FBG sections with different Bragg wavelengths according to each of the foregoing examples shown in FIGS. 7 to 13. The same effects of the foregoing examples can be obtained by causing light in a given band including the Bragg wavelengths based on laser beams generated by the laser to pass through the FBG sections and controlling the laser temperature so that the signal level of the light (corresponding voltage signal) transmitted within the range of the given band has a maximum. Thus, the laser can be controlled so that the signal reaches the level of the Bragg wavelength, the central wavelength in the given band for the light that passes through the FBG sections.

The Bragg wavelengths of the FBG sections shown in FIG. 21 can be controlled in the same manner and with the same effects as in the cases of the examples shown in FIGS. 14 to 20.

Since the respective gratings 61 of the FBG sections 60 have the same diffraction grating spaces, moreover, the FBG sections 60 can be manufactured with ease.

Second Embodiment

Figure 23:
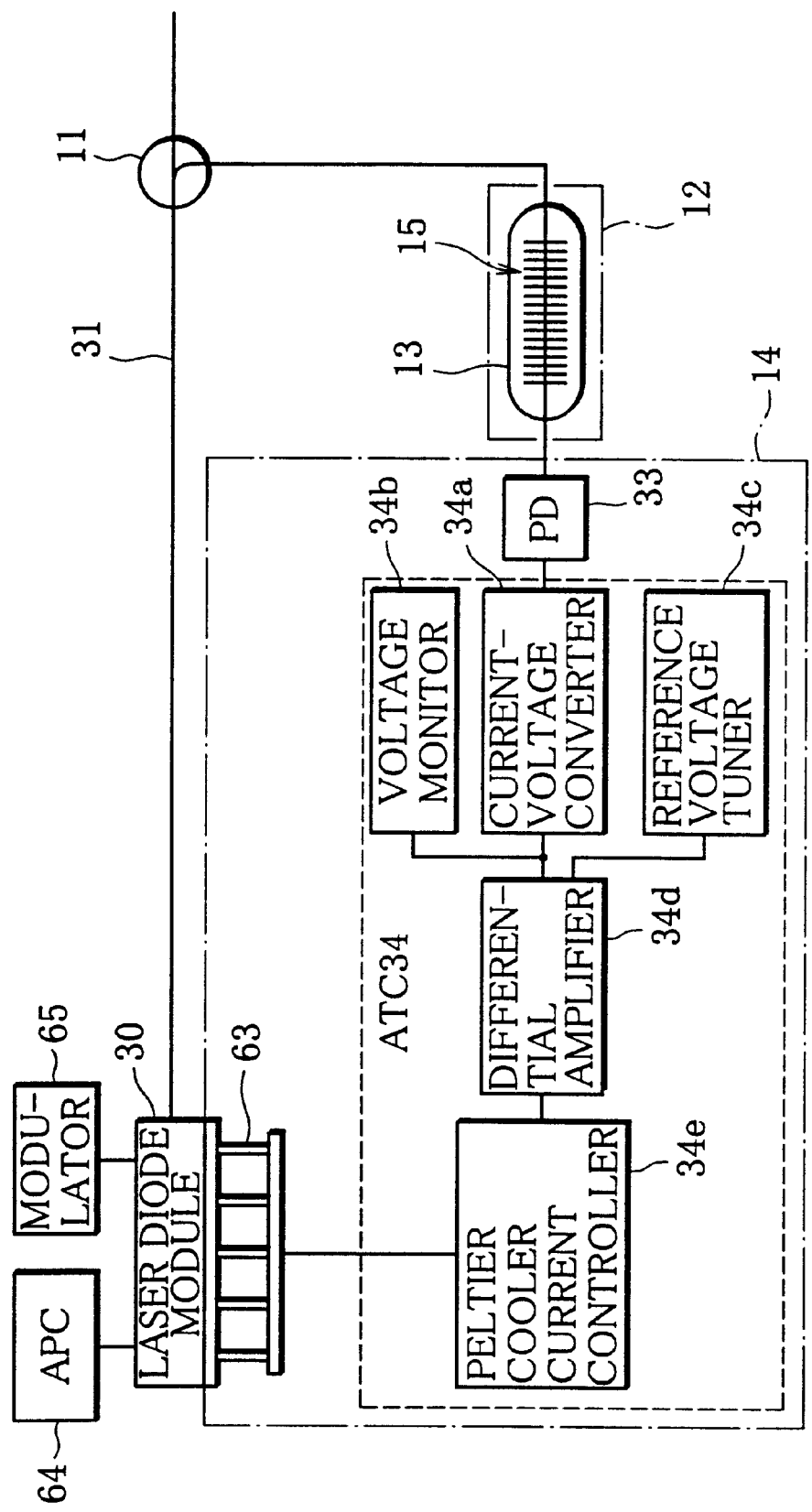
FIG. 23 is a diagram showing an arrangement of a fourth example of the light wavelength tuning device for the optical device according to the invention.

FIG. 23 is a diagram showing a fourth example of the light wavelength tuning device for the optical device according to the present invention. In this example, as shown in FIG. 23, a laser diode module 30 includes a laser, such as a DFB laser, which is used as an optical device for single longitudinal-mode oscillation. A light signal delivered from the laser diode module 30 propagates through a pigtail optical fiber 31 and is branched by means of an optical coupler 11. The resulting branch light beams for wavelength tuning are fetched by means of an optical filter 12. The light transmitted through the filter 12 is detected and subjected to optical-to-electrical conversion by means of a photodiode 33. Based on the resulting converted voltage signal, the temperature of the laser is controlled by means of an ATC 34 and a Peltier cooler 63.

The optical filter 12, like the one shown in FIG. 2, 3 or 5, is provided with an FBG section 15 and a wavelength stabilizer 13 for stabilizing its wavelength characteristic.

The PD 33, ATC 34, and Peltier cooler 63 constitute a wavelength tuner 14. The ATC 34 includes a current-voltage converter 34a, voltage monitor 34b, reference voltage tuner 34c, differential amplifier 34d, and Peltier cooler current controller 34e. The converter 34a converts a signal from the photodiode 33 into a voltage signal. The monitor 34b detects the maximum and minimum levels of the converted voltage signal. The tuner 34c tunes a reference voltage at an optional reference level. The amplifier 34d compares the voltage signal from the voltage converter 34a with the reference voltage. The controller 34e regulates current supplied to the Peltier cooler 63 in accordance with the converted voltage signal, thereby controlling the temperature of the laser diode module 30.

Further, the laser diode module 30 is connected with an APC 64 for controlling current injected into the laser, thereby keeping the optical output constant, and a modulator 65 for outputting a modulation signal. Thus, optical communication by means of the laser diode module 30 is ensured.

It is known that the temperature dependence of the lasing wavelength of the laser is 0.1 nm/° C. The light signal from the laser diode module 30 is branched from the pigtail optical fiber 31 by means of the optical coupler 11. One branch signal component propagates as a light signal through a transmission line, while the other is applied as wavelength tuning light to the optical filter 12.

Figure 24:
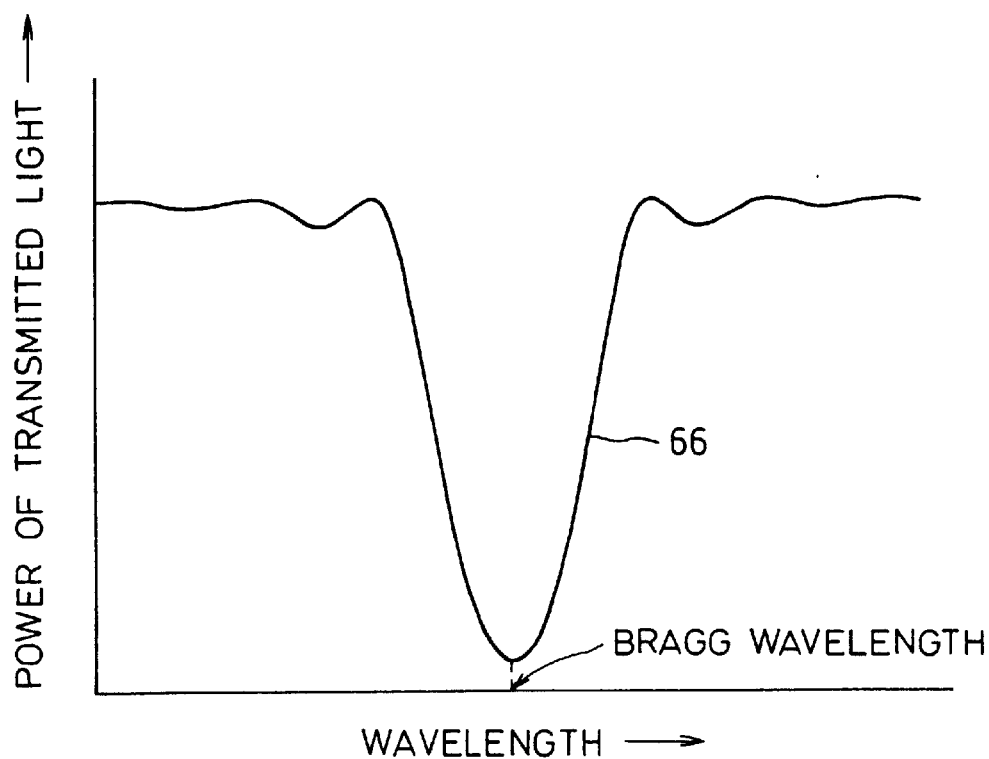
FIG. 24 is a diagram for illustrating the transmission spectrum of an FBG section shown in FIG. 23.

The grating 15a exhibits a notch-type transmission wavelength-level characteristic centering on the Bragg wavelength, and the FBG section 15 serves as a notch-type transmission optical filter. Thus, light transmitted through the FBG section 15 has wavelength dependence such that its power is smallest with the Bragg wavelength and its characteristic curve has slopes on the opposite sides of the Bragg wavelength, individually, as shown in FIG. 24. The optical filter may be designed so that a set wavelength is located on part of a slope 66 of the transmission wavelength-level characteristic curve on either side of the Bragg wavelength.

Figure 25:
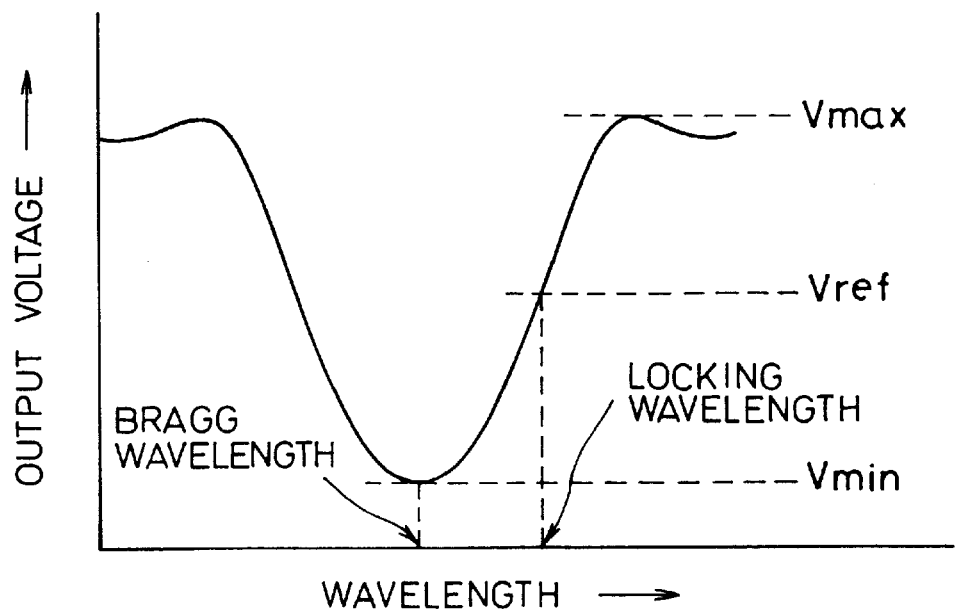
FIG. 25 is a diagram showing the relation between output voltage and wavelength corresponding to light transmitted through the FBG section shown in FIG. 23.

When the light transmitted through the FBG section 15 is applied to the photodiode 33, current based on the power of the transmitted light is delivered from the photodiode 33 and converted into voltage by the current-voltage converter 34a. As shown in FIG. 25, this output voltage has wavelength dependence that is reflective of the transmission spectrum of the grating 15a.

At a point corresponding to the Bragg wavelength, as shown in FIG. 25, the transmitted light power is smallest, so that the detected output voltage is on the minimum level. According to this example, this voltage is given by $V_{min}$. At a point corresponding to the wavelength with which there is no reflection from the grating, on the other hand, the transmitted light power is so great that the detected output voltage is on the maximum level. According to this example, this voltage is given by $V_{max}$.

Further, a reference voltage $V_{ref}$ corresponding to the set wavelength is defined in a voltage characteristic such that voltage change between $V_{min}$ and $V_{max}$ is sloped. In this case, $V_{ref}$ is given by $V_{min} < V_{ref} < V_{max}$. Before the laser temperature is controlled, according to this example, the voltage monitor 34b is controlled to actuate the Peltier cooler current controller 34e and the Peltier cooler 63, whereby the lasing wavelength of the laser in the laser diode module 30 is changed. In this state, $V_{min}$ and $V_{max}$ is measured in advance. In this example, moreover, an intermediate voltage, $(V_{max} - V_{min})/2$, between $V_{min}$ and $V_{max}$ is set as a reference voltage by means of the reference voltage tuner 34c.

According to this example, therefore, the controlled wavelength can be prevented from shifting its position to the shorter-wave side of the Bragg wavelength or to the nonreflection side.

The differential amplifier 34d outputs the difference between the reference voltage from the reference voltage tuner 34c and the voltage signal from the voltage converter 34a. A voltage signal ΔV, indicative of this difference, has wavelength dependence, as shown in FIG. 26.

The Peltier cooler 63 has a property such that its temperature rises or lowers depending on the polarity of the injected current. This property, which varies depending on the method of connection between the Peltier cooler and the circuit, indicates a case in which the temperature lowers so that the laser wavelength shifts to the shorter-wave side when positive current is supplied or in which the temperature rises so that the laser wavelength shifts to the longer-wave side when negative current is supplied, according to this example.

The ATC 34 carries out feedback control so that the voltage signal ΔV is 0. If the lasing wavelength shifts to the longer-wave side, ΔV takes a positive value as it is outputted. If the voltage signal ΔV is applied to the Peltier cooler current controller 34e, therefore, current of a positive value flows through the Peltier cooler 63 to lower the temperature, so that the laser wavelength shifts to the shorter-wave side. If the lasing wavelength shifts to the shorter-wave side, on the other hand, ΔV takes a negative value as it is outputted. If the voltage signal ΔV is applied to the Peltier cooler current controller 34e, therefore, current of a negative value flows through the Peltier cooler 63 to raise the temperature, so that the laser wavelength shifts to the longer-wave side.

Thus, according to this example, the output light of the laser diode module 30 is partially fetched as wavelength tuning light by means of the optical coupler 11 and transmitted through the FBG section 15. The transmitted light is detected and converted into a voltage signal by means of the ATC 34, and compared with the reference voltage obtained from the light transmission spectrum of the FBG section 15. Based on the resulting difference, the injection current of the Peltier cooler 63 is controlled to regulate the laser temperature. Thereupon, the lasing wavelength of the laser is stabilized, so that a desired lasing wavelength can be obtained even after prolonged drive of the laser diode module 30.

According to this example, moreover, the lasing wavelength of the laser is steadily controlled by means of the FBG section 15, ATC 34, and Peltier cooler 63, so that the number of components can be reduced. Thus, according to this example, the lasing wavelength can be tuned with use of a simple construction that is reduced in size and weight. As the number of components is reduced, furthermore, the manufacturing cost can be lowered.

In the case where the light wavelength tuning device of this example is used in a high-density wavelength division multiplexed optical communication system, for example, degradation of transmission signals attributable to wavelength shifts can be prevented, so that the reliability of system transmission can be improved.

In this example, the reference voltage is set at the intermediate value between $V_{min}$ and $V_{max}$ of the light transmission spectrum of the FBG section. Alternatively, however, it may be set at any value between $V_{min}$ and $V_{max}$ without lowering the control stability for the lasing wavelength of the laser.

According to this example, moreover, the light signal is applied to the FBG section after it is branched by means of the optical coupler. Alternatively, however, the lasing wavelength of the laser may be also stabilized by, for example, connecting the FBG section 15 of the invention on the optical path in place of the pigtail optical fiber so that light transmitted through the FBG section can be branched by means of the optical coupler and applied to the photodiode 33.

According to the invention, furthermore, the calculation of $V_{min}$, $V_{max}$, and the reference voltage and setting the reference voltage may be carried out manually in accordance with the measured value obtained by means of the voltage monitor 34b or automatically by means of a microcomputer or the like.

Third Embodiment

If the level of the output light from the laser, controlled by means of the APC, is expected to be fixed, it cannot be perfectly fixed, delicately fluctuating up and down. Thus, in the light wavelength tuning device designed so that the output light is partially used as the wavelength tuning light only and the fixed value is used for the reference voltage, as shown in FIG. 23, the fluctuation of the level of the output light transmitted through the optical filter appears directly as an error component of the light wavelength for control. Thus, the stability of the wavelength of light emitted from the laser is somewhat lowered.

Figure 27:
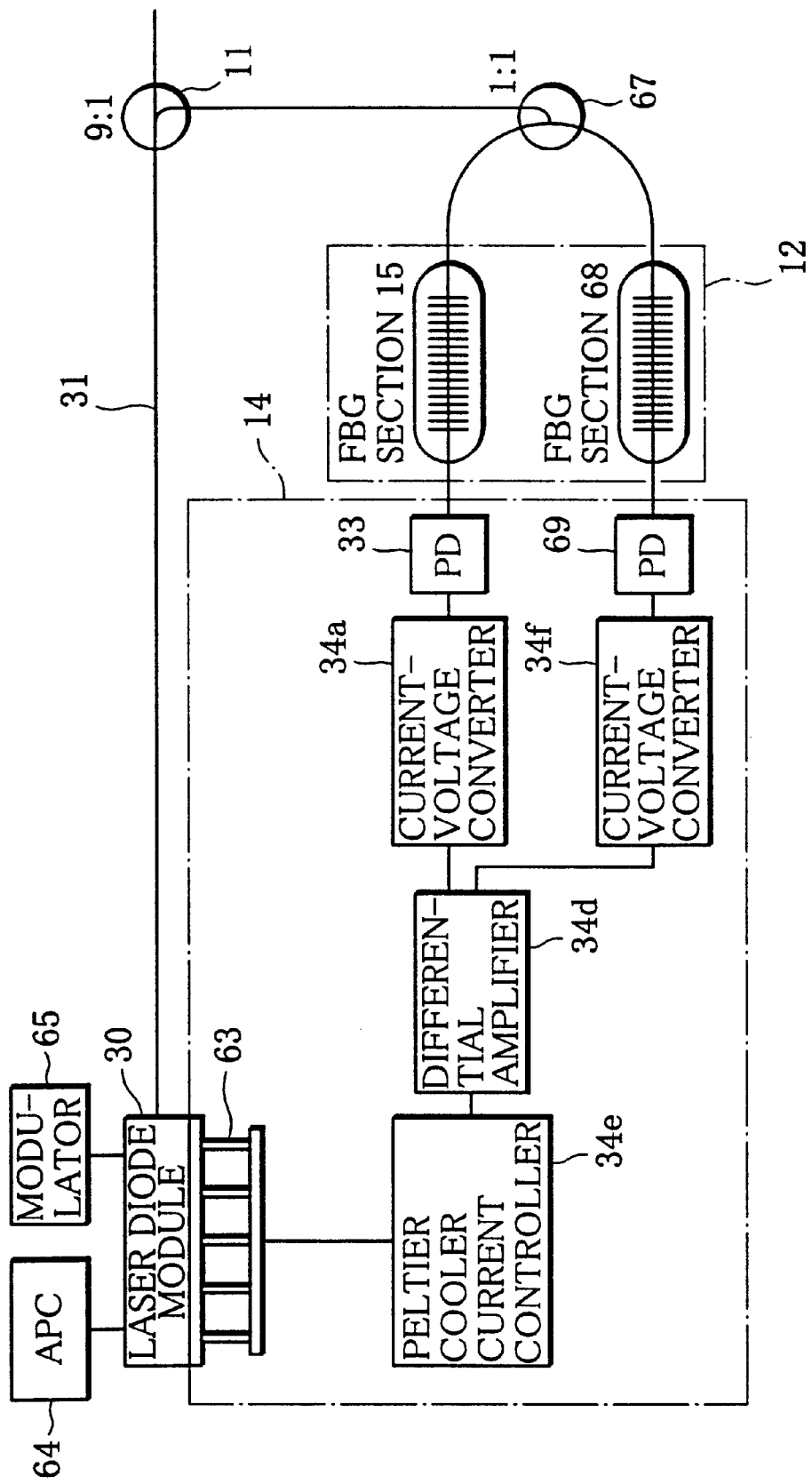
FIG. 27 is a diagram showing an arrangement of a fifth example of the light wavelength tuning device for the optical device according to the invention.

FIG. 27 is a diagram showing an arrangement of a fifth example of the light wavelength tuning device in which the error component of the light wavelength can be canceled. According to this example, as shown in FIG. 27, the tuning device comprises an APC that constitutes an automatic output controller according to the invention and is used to control injection current of a laser in a laser diode module 30. A light signal delivered from the laser diode module 30 is partially branched by means of an optical coupler 11. The resulting branch light beams are further branched and delivered to an optical filter 12. In the filter 12, one of the branch beams is transmitted as wavelength tuning light through an FBG section 15, while the other is reference light through an FBG section 68 that constitutes a reference light pass section according to the invention.

Figure 28:
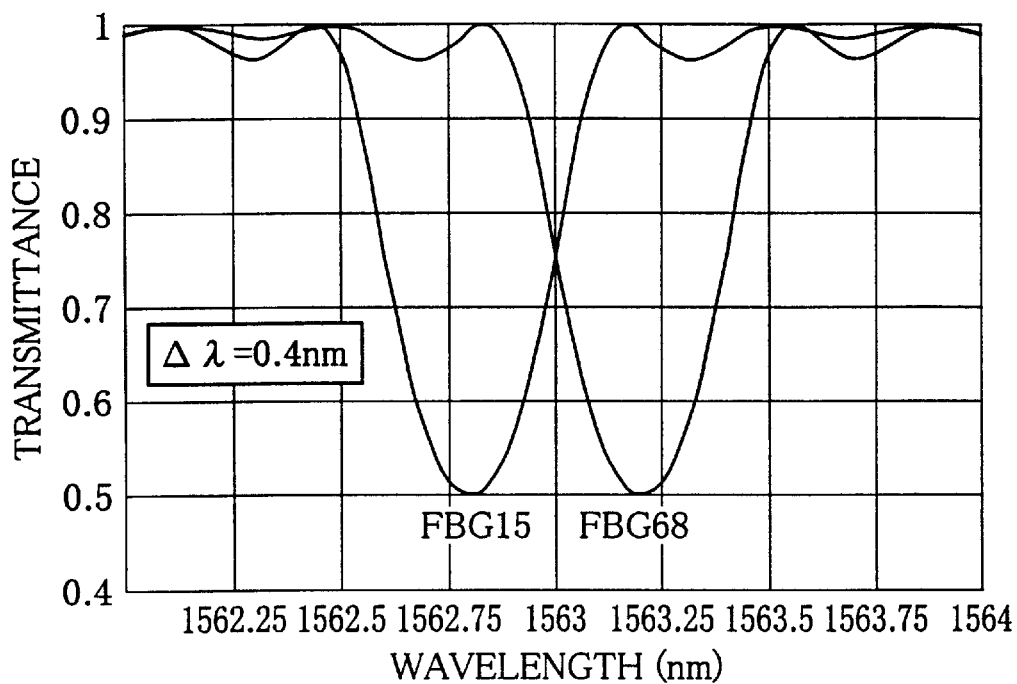
FIG. 28 is a diagram showing the relation between the transmittance and wavelength of FBG sections shown in FIG. 27.
Figure 29:
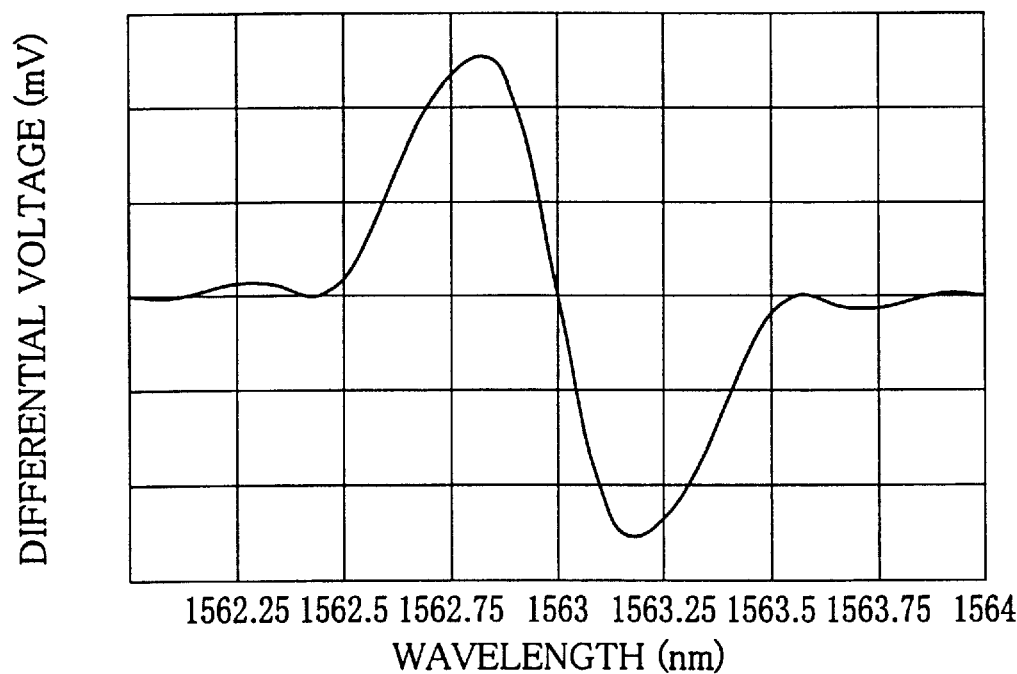
FIG. 29 is a diagram showing the relation between the differential voltage and wavelength of the FBG sections shown in FIG. 27.

The FBG sections 15 and 68 have different Bragg wavelengths, and their wavelength characteristics of transmittance overlap, as shown in FIG. 28, for example. FIG. 28 shows the relation between transmittance and wavelength of the FBG sections 15 and 68 with their full width half maximum Δλ and Bragg-wavelength transmittance at 0.4 nm and 0.5, respectively.

In a wavelength tuner 14, light beams transmitted through the FBG sections 15 and 68 are subjected to optical-to-electrical conversion by photodiodes 33 and 69, and the resulting signals are converted into voltage signals by current-voltage converters 34a and 34f. These voltage signals are amplified at a suitable multiplication factor by means of a differential amplifier 34d, and the difference between the signals is detected. Thereupon, the resulting differential voltage has the wavelength characteristic shown in FIG. 29. A voltage signal indicative of this differential voltage is used as a tuning voltage signal for controlling a Peltier cooler 63. The wavelength of light emitted from the laser diode module 30 is tuned so that the voltage value of the tuning voltage value is approximate to a set voltage value.

Thus, according to this example, the output light is partially branched into two components, wavelength tuning light and reference light, and the resulting differential voltage is fed back to a Peltier cooler current controller 34e, as a signal for controlling the Peltier cooler 63 that is attached to the laser diode module 30. Accordingly, the wavelength error that is attributable to the fluctuation of the level of the output light can be canceled when the differential voltage is obtained, so that the wavelength of the light emitted from the laser diode module 30 can be controlled accurately.

Figure 30:
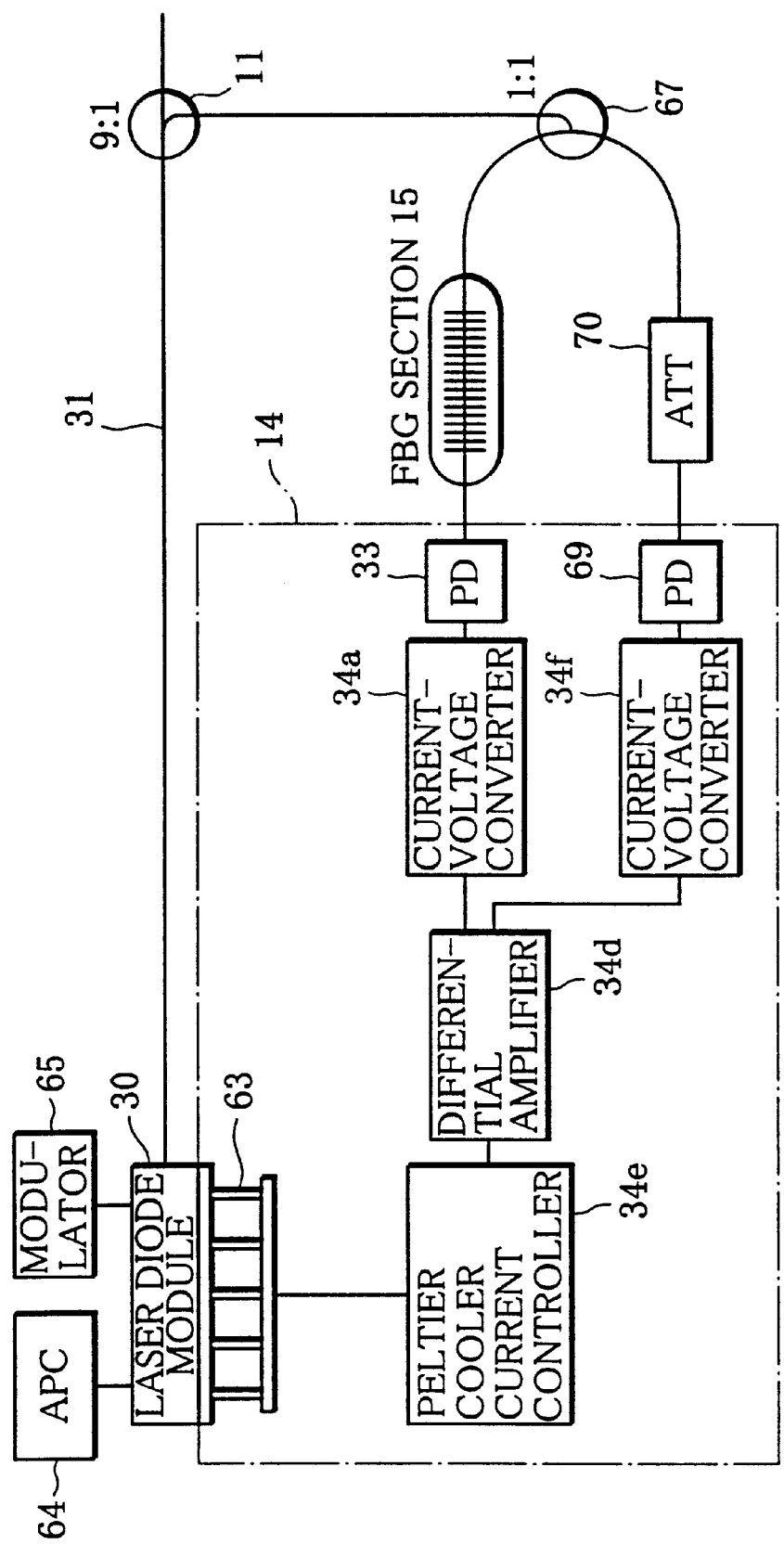
FIG. 30 is a diagram showing an arrangement of a sixth example of the light wavelength tuning device for the optical device according to the invention.

FIG. 30 is a diagram showing an arrangement of a sixth example of the light wavelength tuning device, which is provided with an optical attenuator 70 in place of the FBG section 68 that constitutes the reference light pass section according to the fifth example shown in FIG. 27. In this example, the output level of the attenuator 70 is regulated. The optical attenuator 70 is set so that the reception level of light transmitted through it is higher than that of light transmitted through an FBG section 15 when the wavelength of the light signal is equal to the Bragg wavelength of the FBG section 15.

Figure 31:
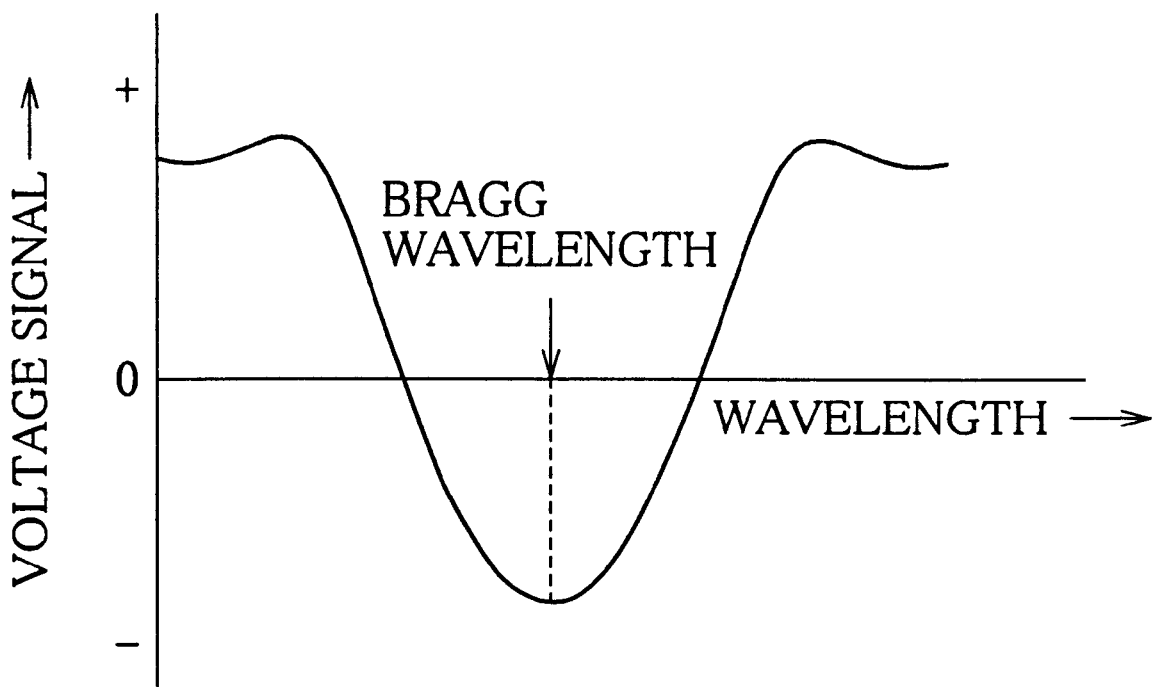
FIG. 31 shows a characteristic curve representing the relation between wavelength and a voltage signal from a differential amplifier shown in FIG. 30.

FIG. 31 shows the characteristic of wavelength compared to the voltage signal indicative of the differential voltage from a differential amplifier 34d. Thus, the voltage signal becomes "0" only when the wavelength concerned is at a given distance on the longer- or shorter-wave side from the Bragg wavelength. The temperature of a laser is controlled by feeding back the voltage signal from the differential amplifier 34d to a Peltier cooler current controller 34e, utilizing the inclination of the voltage signal relative to the wavelength.

In this manner, according to this example, the lasing wavelength of the optical device can be adjusted to a value such that the differential voltage is "0". As in the case of the fifth example, therefore, the wavelength error that is attributable to the fluctuation of the level of the output light can be canceled when the differential voltage is obtained, so that the light wavelength can be stabilized and accurately controlled.

Figure 32:
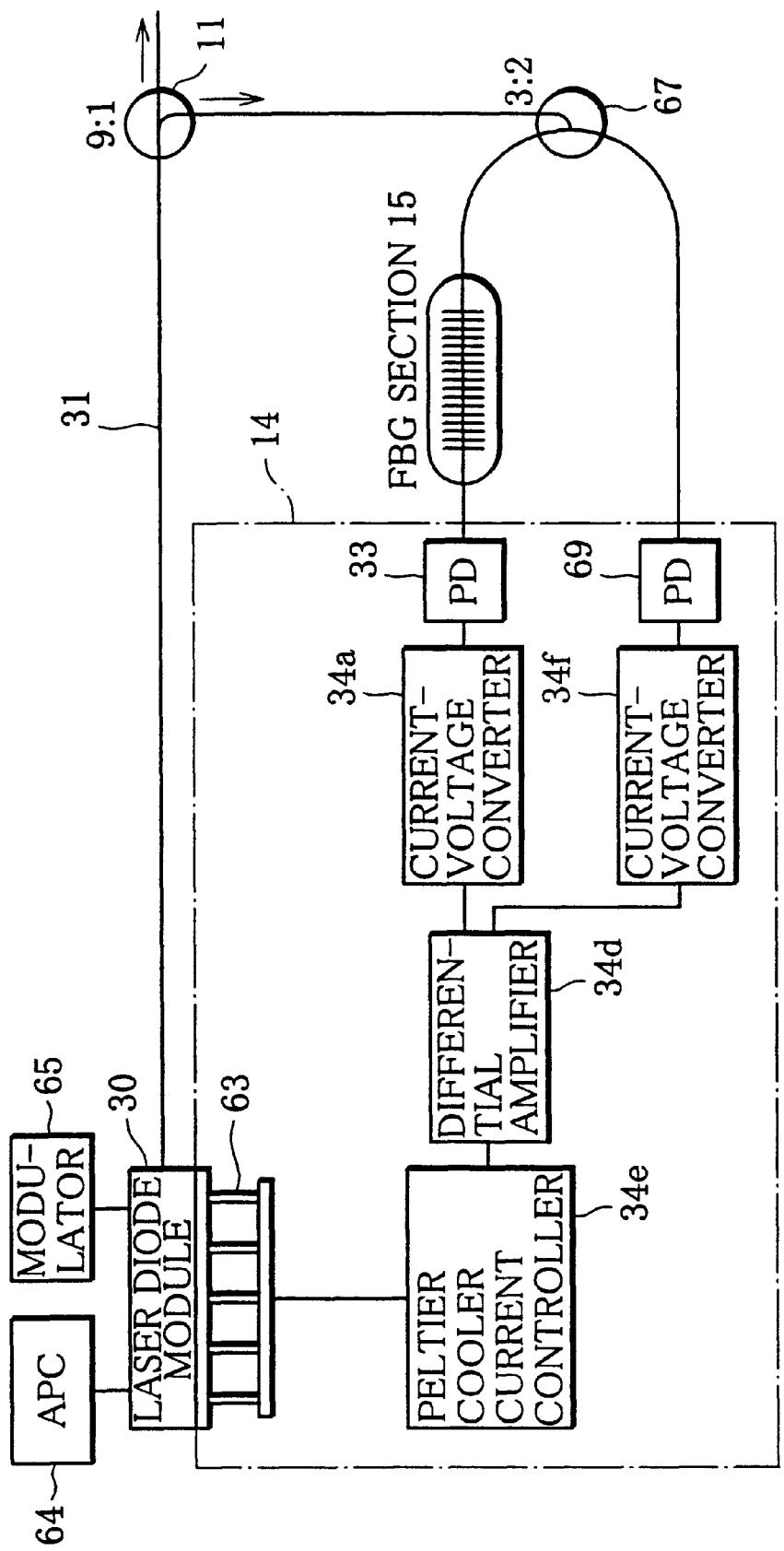
FIG. 32 is a diagram showing an arrangement of a seventh example of the light wavelength tuning device for the optical device according to the invention.

FIG. 32 is a diagram showing an arrangement of a seventh example of the light wavelength tuning device in which a high dividing ratio optical coupler for changing the dividing ratio of light is used, for example, as an optical coupler 67 according to the seventh example. According to this example, as shown in FIG. 32, the high dividing ratio optical coupler 67 and a photodiode 69 are connected directly to each other. In the case where the reflectance of an FBG section 15 is 50%, for example, moreover, the level of light incident upon the FBG section 15 is made higher by setting the dividing ratio of the high dividing ratio optical coupler 67 at 3:2, in order to fix the lasing wavelength of a laser in a laser diode module 30 to a value different from the Bragg wavelength by half the full width at half maximum. By doing this, a voltage signal indicative of a differential voltage having the wavelength characteristic shown in FIG. 31 is created.

Thus, according to this example, reference light can be detected without providing any FBG section or optical attenuator as the reference light pass section if the dividing ratio of the optical coupler 67 is changed. Accordingly, the lasing wavelength from the optical device can be adjusted so that the differential voltage is "0". In consequence, the same effects of the fifth and sixth examples can be obtained, and the number of components can be reduced.

According to the present invention, moreover, the differential amplifier for generating and outputting the differential voltage signal may be provided with an offset mechanism. By regulating the offset of this mechanism, in this case, the zero point of the differential voltage can be finely adjusted to obtain a wavelength such that the differential voltage is "0".

Thus, according to this example, the light wavelength can be controlled more accurately than in the cases of the fifth to seventh examples shown in FIGS. 27, 30 and 32.

Fourth Embodiment

Figure 33:
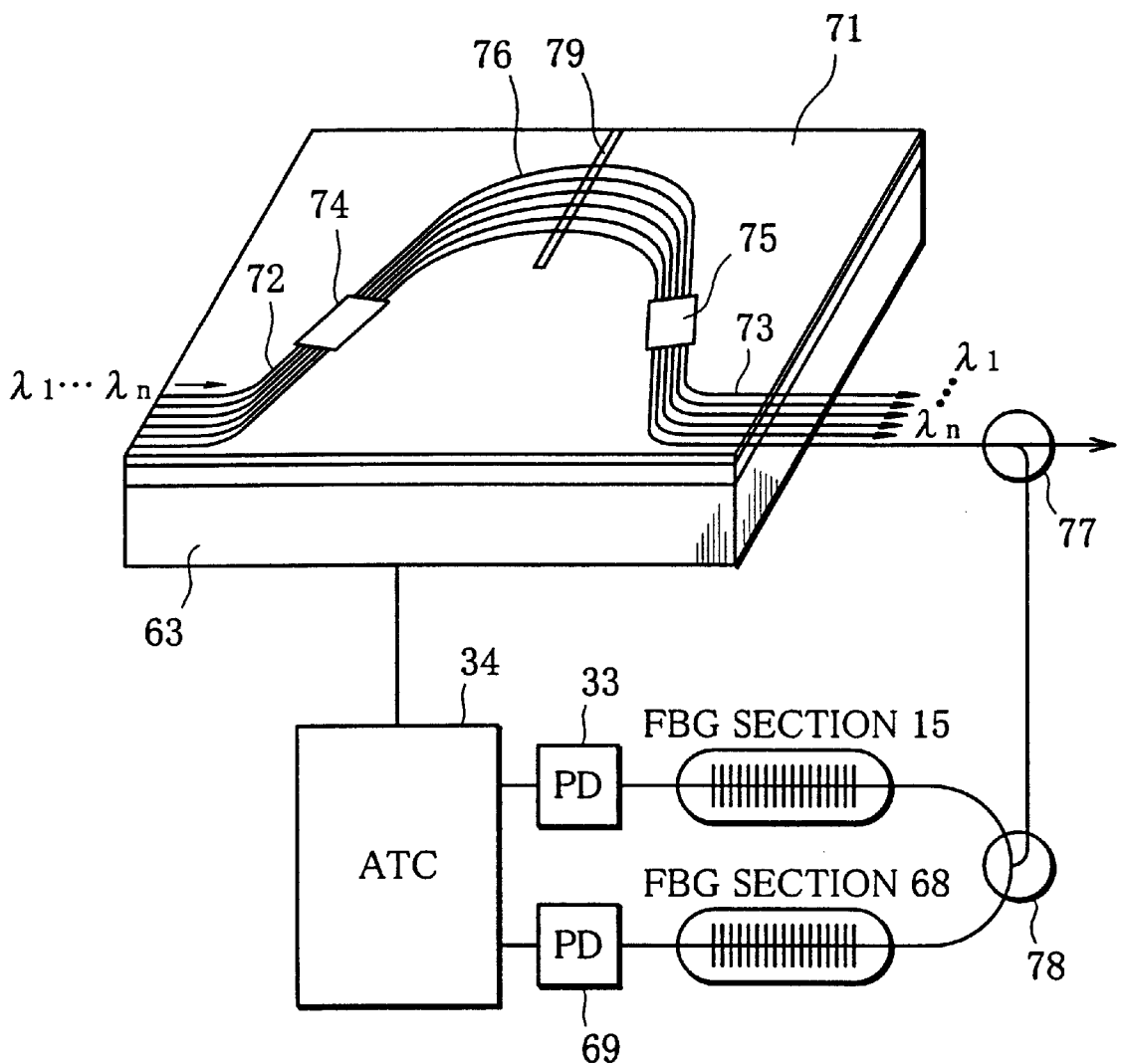
FIG. 33 is a diagram showing an arrangement of an example of an optical demultiplexer according to the invention.

The light wavelength tuning devices according to the basic mode and the first to third embodiments of the invention may be also used in an optical demultiplexer that is provided with an arrayed waveguide grating (AWG) and a WDM filter of a dielectric multilayered film or the like having temperature dependence. FIG. 33 is a diagram showing an example of the optical demultiplexer. In this example, the demultiplexer uses the AWG. As shown in FIG. 33, the WDM filter 71 is furnished with an input waveguide 72, which constitutes an input section according to the invention, and an output waveguide 73, which constitutes an output section according to the invention. Wavelength division multiplexed light, obtained by multiplexing light beams having a plurality of wavelengths λ1 to λn, is inputted through the input waveguide 72, branched by means of slab waveguides 74 and 75 for interference and an arrayed waveguide 76, and delivered to different optical fibers for the individual wavelengths through the output waveguide 73. Numeral 79 denotes a ½ λ polarizer, which serves to adjust the phase of light.

In this example, an optical coupler 77 is connected to one of the optical fibers that transmits a light signal having the wavelength λn, and fetches this light signal. Further, this light signal is forked into two branches by means of an optical coupler 78, and the resulting branch signals are passed individually through the FBG sections 15 and 68 for temperature compensation, which have wavelength characteristics based on the different Bragg wavelengths shown in FIG. 28. The signals are subjected to optical-to-electrical conversion by means of photodiodes 33 and 69 and converted by means of an ATC 34. Voltage signals are detected from these converted signals, individually. Furthermore, the ATC 34 detects a differential voltage from these voltage signals, and controls a Peltier cooler 63 that is attached to the WDM filter 71, thereby controlling the temperature of the filter 71, in response to a signal indicative the differential voltage.

Thus, in this example, feedback control is carried out for light with one wavelength so that the differential voltage is "0". Accordingly, the pass level can be adjusted for all the wavelengths of the WDM filter concerned, so that the optical demultiplexer can enjoy a simple construction. Since the wavelength error that is attributable to the fluctuation of the level of the output light can be canceled when the differential voltage is obtained, moreover, the wavelength of the light to be filtered can be stabilized.

In the case of a WDM filter that uses a dielectric multi-layered film, the wavelength characteristic can be regulated also by changing the filter angle. Accordingly, this WDM filter is designed so that the differential voltage signal is fed back to a control mechanism for adjusting the filter angle. As in the cases of the foregoing examples, therefore, the wavelength error can be canceled when the differential voltage is obtained, so that the light wavelength can be stabilized and accurately controlled.

Fifth Embodiment

A WDM optical communication system may be constructed using the laser diode module according to any of the first to third embodiments and the optical demultiplexer according to the fourth embodiment. FIG. 34 is a diagram showing an example of this system. Referring now to FIG. 34, there are shown laser diode modules 81 to 8n, which individually constitute light sources according to the invention and output light beams having different wavelengths.

Further, some of output light beams from the laser diode modules 81 to 8n are used as wavelength tuning light, and the respective wavelengths of the output light beams are tuned by means of the light wavelength tuning device according to any of the first to third embodiments. Thus, the laser diode modules 81 to 8n are adjusted individually to set wavelengths. The light beams emitted individually from the laser diode modules 81 to 8n are multiplexed by means of a WDM coupler 90, and the resulting wavelength division multiplexed light is transmitted to a multiplexed optical signal transmission line 91. The multiplexed light transmitted through the transmission line 91 is applied to a WDM filter 92 that is composed of the optical demultiplexer according to the fourth embodiment, and is divided into light beams with different wavelengths. These light beams are applied individually to optical-to-electrical converters 101 to 10n that constitute a light receiver according to the invention. The converters 101 to 10n individually receive the different-wavelength light beams from the WDM filter 92, and output them as electrical signals.

Thus, according to this example, lasers in the laser diode modules 81 to 8n can be adjusted individually to given lasing wavelengths by means of the light wavelength tuning device on the transmission side, and the passing wavelengths can be tuned by means of the optical demultiplexer on the reception side so that the multiplexed light is divided into light beams with different wavelengths. In this example, therefore, a wavelength error that is attributable to fluctuation in environmental temperature can be restrained, so that the wavelength division multiplexed optical communication system is subject to less degradation in transmission quality.

Sixth Embodiment

Further, a WDM optical communication system may be constructed using a plurality of laser diode modules arranged on one and the same temperature controlling device and the optical demultiplexer according to the fourth embodiment. FIG. 35 is a diagram showing an example of this system. Referring now to FIG. 35, there are shown laser diode modules 81 to 8n on the transmission side. The modules 81 to 8n are arranged on one and the same Peltier cooler 110, which constitutes the temperature controlling device of the invention, by means of a module fixing plate 111 that has good thermal conductivity. Further, a thermistor 112 is provided on the fixing plate 111, and delivers a detected temperature to an ATC 113. The ATC 113 controls the temperature of the Peltier cooler 110 to keep the respective temperatures of the laser diode modules 81 to 8n constant so that the temperature from the thermistor 112 is constant. Thus, the lasing wavelength of the lasers in the laser diode modules 81 to 8n can be kept fixed. Light beams emitted individually from the laser diode modules 81 to 8n are multiplexed by means of an optical coupler or WDM coupler 90, and the resulting wavelength division multiplexed light is transmitted to a multiplexed optical signal transmission line 91.

On the reception side, the passing wavelength is tuned by means of the WDM filter 92, and the multiplexed light is divided into light beams with different wavelengths, whereupon the different-wavelength light beams are received by optical-to-electrical converters 101 to 10n, individually.

Thus, in this example, the laser diode modules 81 to 8n are arranged on the same Peltier cooler 110, and the respective temperatures of the lasers are controlled collectively, whereby the wavelength of each laser can be kept fixed. In the WDM filter 92, moreover, the wavelength of light that passes through an output section can be kept fixed, so that the wavelength division multiplexed optical communication system is subject to less degradation in transmission quality.

It is to be understood that the present invention is not limited to the embodiments described above, and that various changes and modifications may be effected therein by one skilled in the art without departing from the scope or spirit of the invention.

For example, the optical filter according to each embodiment outputs the light beams that pass through the FBG sections for wavelength tuning light and reference light. Alternatively, however, the optical filter may be designed to output reflection of these light beams.

As described above, the light wavelength tuning device according to the present invention comprises an optical filter for outputting part of light emitted from an optical device as wavelength tuning light by transmission or reflection, the output level of the wavelength tuning light varying with the change of the wavelength of the tuning light, and a wavelength tuner for tuning the wavelength of the light emitted from the optical device so that the output level of the wavelength tuning light delivered from the optical filter is approximate to a given value. Further, the optical filter includes a fiber Bragg grating section provided with a wavelength stabilizer, so that the temperature dependence of wavelength tuning operation can be lowered.

In the light source according to the invention, which includes an automatic output controller, output light is partially used as wavelength tuning light, and the temperature of an optical device is controlled by means of the light wavelength tuning device according to claim 5 that is characterized by comprising the optical filter and the wavelength tuner. Accordingly, fluctuation of the lasing wavelength can be reduced with use of a simple construction.

Further, the optical demultiplexer according to the invention comprises an input section for receiving wavelength division multiplexed light obtained by multiplexing light beams having a plurality of wavelengths, and an output section for dividing the wavelength division multiplexed light into a plurality of light beams for the individual wavelengths and outputting the beams. In the optical demultiplexer, moreover, any one of the light beams having any wavelength delivered from the output section is used as wavelength tuning light, and the wavelength of the light delivered from the optical demultiplexer is tuned by means of the light wavelength tuning device according to any one of claims 1 to 5 that is characterized by comprising the optical filter and the wavelength tuner. Accordingly, fluctuation of the passing wavelength can be reduced with use of a simple construction.

Furthermore, the wavelength division multiplexed optical communication system according to the invention comprises a plurality of light sources for emitting light beams having different wavelengths, a multiplexed light transmission line for transmitting wavelength division multiplexed light obtained by multiplexing the light beams emitted from the light sources, the optical demultiplexer according to claim 7 whereby the wavelength division multiplexed light transmitted through the multiplexed light transmission line is received, divided into the light beams having the different wavelengths, and outputted, and a light receiver for receiving the individual light beams delivered from the optical demultiplexer. The output light of each of the light sources is partially used as wavelength tuning light, the wavelength of the output light being tuned by means of the light wavelength tuning device according to any one of claims 1 to 5 that is characterized by comprising the optical filter and the wavelength tuner. Thus, degradation in transmission quality can be lessened.

What is claimed is:

1. An optical demultiplexer comprising:
   an input section for receiving wavelength division multiplexed light obtained by multiplexing light beams having a plurality of wavelengths;
   an output section for dividing the wavelength division multiplexed light into a plurality of light beams for the individual wavelengths and outputting the beams; and
   a light wavelength tuning device comprising an optical filter, including a fiber Bragg grating section provided with a wavelength stabilizer, that outputs part of any one of the light beams having any wavelength delivered from the output section as wavelength tuning light by transmission or reflection, with an output level of the wavelength tuning light varying with a change of wavelength of the tuning light, and a wavelength tuner for tuning the wavelength of the light emitted from the output section so that the output level of the wavelength tuning light delivered from the optical filter is approximately equal to a given value.

2. The optical demultiplexer according to claim 1, wherein said optical filter is formed by arranging two fiber Bragg grating sections with different Bragg wavelengths in series, and said wavelength tuner tunes the wavelength of each light beam from the output section so that the output level of the wavelength tuning light from the optical filter is approximately equal to a peak value between the respective Bragg wavelengths of the two fiber Bragg grating sections.

3. The optical demultiplexer according to claim 1, wherein said optical filter comprises a resonator formed by arranging a plurality of fiber Bragg grating sections in series, and said wavelength tuner tunes the wavelength of each light beam from the output section so that the output level of the wavelength tuning light from the optical filter is approximately equal to a peak value corresponding to a Bragg wavelength of the fiber Bragg grating sections.

4. The optical demultiplexer according to claim 1, wherein said wavelength tuner tunes the wavelength of each light beam from the output section so that the output level of the wavelength tuning light from the optical filter is approximately equal to a given level on a slope of a wavelength dependence curve of the fiber Bragg grating section.

5. The optical demultiplexer according to claim 1, wherein said optical filter causes a first branch beam of any one of the light beams from the output section to be transmitted or reflected as the wavelength tuning light by the fiber Bragg grating section having a given Bragg wavelength, and causes a second branch beam to be transmitted or reflected as reference light by a reference light pass section, and said wavelength tuner tunes the wavelengths of the light beams from the output section so that a tuning voltage value, based on a difference between an output level of the wavelength tuning light delivered from the fiber Bragg grating section and an output level of the reference light delivered from the reference light pass section, is approximately equal to a given set voltage value.

6. A wavelength division multiplexed optical communication system, comprising:
   a plurality of light sources for emitting light beams having different wavelengths;
   a multiplexed light transmission line for transmitting a wavelength division multiplexed light obtained by multiplexing the light beams emitted from the light sources;
   an optical demultiplexer according to any one of claims 1, 2–5, wherein the wavelengths of the light beams delivered from the optical demultiplexer are tuned by means of the light wavelength tuning device; and
   a plurality of light receivers, each of which receives the individual light beams delivered from the optical demultiplexer.

7. A wavelength division multiplexed optical communication system, comprising:
   a plurality of light sources for emitting light beams having different wavelengths;
   a temperature controlling device on which the light sources are arranged for controlling the respective temperatures of the light sources, collectively;
   a multiplexed light transmission line for transmitting wavelength division multiplexed light obtained by multiplexing the light beams emitted from the light sources;
   an optical demultiplexer according to any one of claims 1, 2–5, wherein the wavelengths of the light beams delivered from the optical demultiplexer are tuned by means of the light wavelength tuning device; and
   a plurality of light receivers, each of which receives the individual light beams delivered from the optical demultiplexer.

8. A wavelength division multiplexed optical communication system, comprising;
   a plurality of light sources for emitting light beams having different wavelengths;
   a plurality of first light wavelength tuning devices for the individual light sources, each first light wavelength tuning device comprising a first optical filter, including a first fiber Bragg grating section provided with a first wavelength stabilizer, that outputs part of the light beam emitted from a corresponding one of the light sources as wavelength tuning light by transmission or reflection, with an output level of the wavelength tuning light varying with a change of wavelength of the tuning lights and a first wavelength tuner for tuning the wavelength of the light emitted from the corresponding one of the light sources so that the output level of the wavelength tuning light delivered from the first optical filter is approximately equal to a first given value;
   a multiplexed light transmission line for transmitting wavelength division multiplexed light obtained by multiplexing the light beams emitted from the light sources;
   an optical demultiplexer comprising an input section for receiving wavelength division multiplexed light transmitted through the multiplexed light transmission line, and an output section for dividing the wavelength division multiplexed light into a plurality of light beams for the individual wavelengths and outputting the beams;
   a second light wavelength tuning device comprising a second optical filter, including a second fiber Bragg grating section provided with a second wavelength stabilizer, that outputs part of any one of the light beams having any wavelength delivered from the output section of the optical demultiplexer as wavelength tuning light by transmission or reflection, with an output level of the wavelength tuning light varying with a change of wavelength of the tuning light, and a second wavelength tuner for tuning the wavelength of the light emitted from the output section of the optical demultiplexer so that the output level of the wavelength tuning light delivered from the second optical filter is approximately equal to a second given value; and a plurality of light receivers, each of which receives the individual light beams delivered from the optical demultiplexer.

9. The wavelength division multiplexed optical communication system according to claim 8, wherein the first optical filter is formed by arranging two first fiber Bragg grating sections with different Bragg wavelengths in series, and the first wavelength tuner tunes the wavelength of the light emitted from the corresponding one of the light sources so that the output level of the wavelength tuning light from the first optical filter is approximately equal to a peak value between the respective Bragg wavelengths of the first two fiber Bragg grating sections.

10. The wavelength division multiplexed optical communication system according to claim 8, wherein the first optical filter comprises a resonator formed by arranging a plurality of first fiber Bragg grating sections in series, and the first wavelength tuner tunes the wavelength of the light emitted from the corresponding one of the light sources so that the output level of the wavelength tuning light from the first optical filter is approximately equal to a peak value corresponding to a Bragg wavelength of the first fiber Bragg grating sections.

11. The wavelength division multiplexed optical communication system according to claim 8, wherein the first wavelength tuner tunes the wavelength of the light from the corresponding one of the light sources so that the output level of the wavelength tuning light from the first optical filter is approximately equal to a given level on a slope of a wavelength dependence curve of the first fiber Bragg grating section.

12. The wavelength division multiplexed optical communication system according to claim 8, wherein the first optical filter causes a first branch beam of the light from the corresponding one of the light sources to S be transmitted or reflected as the wavelength tuning light by the first fiber Bragg grating section having a given Bragg wavelength, and causes a second branch beam to be transmitted or reflected as reference light by a reference light pass section, and the first wavelength tuner tunes the wavelength of the light from the corresponding one of the light sources so that a tuning voltage value, based on a difference between an output level of the wavelength tuning light delivered from the first fiber Bragg grating section and an output level of the reference light delivered from the reference light pass section, is approximately equal to a given set voltage value.

* * * * *